(12) United States Patent  (10) Patent No.: US 7,748,112 B2
Hirata et al.  (45) Date of Patent: Jul. 6, 2010

(54) COMPONENT MOUNTING APPARATUS AND COMPONENT MOUNTING METHOD

(75) Inventors: Shuichi Hirata, Osaka (JP); Makoto Morikawa, Nara (JP); Shinya Marumo, Osaka (JP); Yasuharu Ueno, Osaka (JP); Takafumi Tsujisawa, Osaka (JP)

(73) Assignee: Panasonic Corporation, Osaka (JP)

( * ) Notice: Subject to any disclaimer, the term of this patent is extended or adjusted under 35 U.S.C. 154(b) by 326 days.

(21) Appl. No.: 11/792,235
(22) PCT Filed: Dec. 6, 2005
(86) PCT No.: PCT/JP2005/022364
§ 371 (c)(1),
(2), (4) Date: Jun. 28, 2007
(87) PCT Pub. No.: WO2006/062091
PCT Pub. Date: Jun. 15, 2006

(65) Prior Publication Data
US 2008/0127486 A1 Jun. 5, 2008

(30) Foreign Application Priority Data
Dec. 6, 2004 (JP) .............................. 2004-352748

(51) Int. Cl.
H05K 3/30 (2006.01)
(52) U.S. Cl. .............................. 29/833; 29/832; 29/834; 29/709; 29/739; 29/740; 438/14; 438/16; 438/27; 438/106; 438/107
(58) Field of Classification Search .................. 29/832, 29/833, 834, 739, 740, 743, 709; 438/14, 438/16, 27, 106, 107, 109
See application file for complete search history.

(56) References Cited
U.S. PATENT DOCUMENTS
6,183,589 B1 * 2/2001 Kim et al. .................. 156/249
2003/0049915 A1 * 3/2003 Abe et al. .................. 438/455
2003/0057552 A1 3/2003 Kainuma et al.
2003/0084563 A1 * 5/2003 Ohkubo et al. ................. 29/740

FOREIGN PATENT DOCUMENTS
| JP | 5-198620 | 8/1993 |
| JP | 7-122596 | 5/1995 |
| JP | 11-87431 | 3/1999 |
| JP | 2001-189339 | 7/2001 |
| JP | 2003-86758 | 3/2003 |
| JP | 2003-152031 | 5/2003 |
| JP | 2004-87611 | 3/2004 |

OTHER PUBLICATIONS
Chinese Office Action (in English language), issued Sep. 19, 2008.
* cited by examiner Primary Examiner—Derris H Banks
Assistant Examiner—Azm Parvez
(74) Attorney, Agent, or Firm—Wenderoth, Lind & Ponack, L.L.P.

(57) ABSTRACT

A component mounting apparatus has a stage 41 with a fixed height position for holding a substrate 5, and a mounting head 48 that releasably holds a component 2, is moved downward toward the stage 41 from a first reference height position $HB_1$ fixedly positioned above the stage 41, and mounts the held component 2 on the substrate 5 or an already mounted component 2. A controller 14 has a mounting reference height calculation unit 103 for calculating a mounting reference height $H_n$ corresponding to a distance from the first reference height position $HB_1$, and a first target movement height calculation unit 104 for calculating a first target movement height $ZTAG_n$ based on at least the mounting reference height $H_n$ and a thickness $PT_n$ of the component 2 held by the mounting head 48. The controller 14 moves the mounting head 48 holding the component 2 downward from the first reference height position $HB_1$ to the first target movement height $ZTAG_n$ to mount the held component 2 on the substrate 5 or the already mounted component 2.

12 Claims, 28 Drawing Sheets

COMPONENT MOUNTING APPARATUS AND COMPONENT MOUNTING METHOD

BACKGROUND OF THE INVENTION

1. Technical Field of the Invention

The present invention relates to a component mounting apparatus and a component mounting method. In particular, the present invention relates to an apparatus and method for stacked mounting in which a plurality of components such as IC chips are mounted on a substrate in stack manner.

2. Description of Related Art

Japanese Patent Application Laid-open Publication No. 2004-186182 discloses a component mounting apparatus for mounting IC chips on a substrate. This component mounting apparatus comprises a loader for supplying a substrate into the apparatus from outside the apparatus, a mounting stage for holding the substrate, a substrate carry-in apparatus for carrying the substrate from the loader onto the mounting stage, a mounting head for mounting IC chips onto the substrate held on the mounting stage, a conveying head for conveying the IC chips from a component supply unit to the mounting head, an unloader for discharging the substrate on which the IC chips have been mounted from inside the apparatus to outside the apparatus, and a substrate carry-out apparatus for conveys the substrate on which the IC chips have been mounted from the mounting stage to the unloader.

In recent years, for achieving high functionality and high integration, there has been increased demands for stacked mounting in which a plurality of components such as IC chips are mounted on a substrate in stack manner. In such stacked mounting, a height used as standard for mounting the component or applying a liquid material varies each time the component is mounted. However, a component mounting apparatus can execute the stacked mounting efficiently with consideration given to the characteristic of stacked mounting has not been provided.

SUMMARY OF THE INVENTION

It is an object of the present invention to provide a component mounting apparatus and a component mounting method according to which the stacked mounting can be executed efficiently.

A first aspect of the present invention provides a component mounting apparatus for mounting a plurality of components on a substrate in stack manner comprising, a stage with a fixed height position adapted to hold the substrate, a mounting head adapted to releasably hold the component, to be moved downward toward the stage from a first reference height position fixedly positioned above the stage, and to mount the held component on the substrate or an already mounted component, and a controller including a mounting reference height calculation unit for calculating a mounting reference height corresponding to a distance from the first reference height position to the substrate or the already mounted component, and a first target movement height calculation unit for calculating a first target movement height based on at least the mounting reference height calculated by the mounting reference height calculation unit and a thickness of the component held by the mounting head, the controller moving the mounting head which holds the component downward from the first reference height position to the first target movement height to mount the held component on the substrate or the already mounted component.

The mounting reference height calculation unit calculates the mounting reference height corresponding to the distance from the first reference height position to the substrate or the already mounted component, and then the first target movement height calculation unit calculates the first target movement height using the mounting reference height. The mounting head is moved downward from the first reference height position to the first target movement height, and the held component is mounted on the substrate or the already mounted component. Therefore, the greater the number of already mounted components, i.e. the greater the number of layers of the components already mounted on the substrate, the more the first target movement height is raised up to approach the first reference height position. In other words, as the number of layers of the components mounted on the substrate increases, the amount by which the mounting head holding the component to be mounted next is moved downward from the first reference height position toward the stage is automatically adjusted. As a result, a plurality of components can be stack-mounted continuously, thereby achieving efficient stacked mounting.

Specifically, the mounting head is provided with a holding portion (54) for holding the component, a base portion relative to which the holding portion can be displaced in a direction of the first reference height position, and a first sensor for detecting an actual push amount which is an amount of displacement of the holding portion relative to the base portion when the held component is mounted. The mounting reference height calculation unit calculates the mounting reference height based on at least the actual push amount.

Alternatively, the mounting head is provided with a second sensor for detecting an actual movement height which is a height of the mounting head with reference to the first reference height position when the held component is mounted. The mounting reference height calculation unit calculates the mounting reference height based on at least the actual movement height.

The component mounting may further comprise a recognition camera capable of recognizing at least the component held by the mounting head and the substrate, and the controller may execute alignment of the component held by the mounting head with the already mounted component using recognition result of the substrate by the recognition camera. Further, the component mounting apparatus may further comprising a recognition camera capable of recognizing at least the component held by the mounting head and a lowermost-layer component already mounted on the substrate, and the controller may execute alignment of the component held by the mounting head with the already mounted component using recognition result of the lowermost-layer component by the recognition camera. The aligning of the component to be mounted relative to the already mounted component always based on the same object, i.e. the substrate or the lowermost-layer component can achieve highly precise and stable stacked mounting. Furthermore, the component mounting apparatus may further comprise a recognition camera capable of recognizing at least the component held by the mounting head and an uppermost-layer component already mounted on the substrate, and the controller may execute alignment of the component held by the mounting head with the already mounted component using recognition result of the uppermost-layer component by the recognition camera.

The component mounting apparatus may further comprise an application head adapted to be moved downward toward the stage from a second reference height position fixedly positioned above the stage to apply a liquid material onto the substrate or the already mounted component. In this arrangement, the controller further includes a second target movement height calculation unit (105) for calculating a second target movement height ($DZTAG_n$) based on at least the mounting reference height. The controller moves the application head downward from the second reference height position to the second target movement height calculated by the second target movement height calculation unit to apply the liquid material onto the substrate or the already mounted component.

A second aspect of the present invention provides a component mounting apparatus for mounting a plurality of components on a substrate in stack manner comprising, a stage adapted to hold the substrate and capable of being raised and lowered, a mounting head adapted to releasably hold the component, to be moved downward toward the stage from a first reference height position above the stage, and to mount the held component on the substrate or an already mounted component, and a controller including a stage height calculation unit for calculating a stage height which is a height of the stage from the first reference height position such that a mounting reference height corresponding to a distance from the first reference height position to the substrate or the already mounted component is kept constant, and a first target movement height calculation unit for calculating a first target movement height based on at least the mounting reference height and a thickness of the component held by the mounting head, the controller lowering the stage to the stage height calculated by the stage height calculation unit, and then moving the mounting head which holds the component downward from the first reference height position to the first target movement height calculated by the first target movement height calculation unit to mount the held component on the substrate or the already mounted component.

The stage height calculation unit calculates the stage height which is the height of the stage from the first reference height position such that the mounting reference height corresponding to the distance from the first reference height position to the substrate or the already mounted component is kept constant. The stage is lowered to the calculated stage height position, and then the mounting head is moved downward to the first target movement height calculated using the mounting reference height, and the held component is mounted on the substrate or the already mounted component. In other words, as the number of already mounted components, i.e. the number of layers of components already mounted on the substrate, increases, the stage is lowered away from the reference height position, thereby the mounting reference height is automatically kept constant and the mounting head mounts each component on the substrate or an already mounted component based on the constant or fixed mounting reference height. Therefore, a plurality of components can be stack-mounted continuously, achieving efficient stacked mounting.

Specifically, the mounting head is provided with a holding portion for holding the component, a base portion relative to which the holding portion can be displaced in a direction of the first reference height position, and a first sensor for detecting an actual push amount which is an amount of displacement of the holding portion relative to the base portion when the held component is mounted. The stage height calculation unit calculates the stage height based on at least the actual push amount.

Alternatively, the mounting head is provided with a second sensor for detecting an actual movement height which is a height of the mounting head with reference to the first reference height position when the held component is mounted. The stage height calculation unit calculates the stage height based on at least the actual movement height.

The component mounting apparatus may further comprise an application head adapted to be moved downward toward the stage from a second reference height position fixedly positioned above the stage to apply a liquid material onto the substrate or the already mounted component. In this arrangement, the controller further includes a second target movement height calculation unit (105) for calculating a second target movement height ($DZTAG_n$) based on at least the mounting reference height. The controller moves the application head downward from the second reference height position to the second target movement height calculated by the second target movement height calculation unit to apply the liquid material onto the substrate or the already mounted component.

A third aspect of the present invention provides a component mounting method for mounting a plurality of components on a substrate in stack manner comprising, providing a stage (41) with a fixed height position adapted to hold the substrate, providing a mounting head adapted to releasably hold the component, and to mount the held component on the substrate or an already mounted component, calculating a mounting reference height corresponding to a distance from a reference height position ($HB_1$) above the stage to the substrate or the already mounted component, calculating a first target movement height based on at least the mounting reference height and a thickness of the component held by the mounting head, and moving the mounting head which holds the component downward from the reference height position to the target movement height to mount the held component on the substrate or the already mounted component.

A fourth aspect of the present invention provides a component mounting method for mounting a plurality of components on a substrate in stack manner comprising, providing a stage adapted to hold the substrate and capable of being raised and lowered, providing a mounting head adapted to releasably hold the component, and to mount the held component on the substrate or an already mounted component, calculating a stage height which is a height of the stage from a reference height position above the stage such that a mounting reference height corresponding to a distance from the reference height position to the substrate or the already mounted component is kept constant, calculating a first target movement height based on at least the mounting reference height and a thickness of the component held by the mounting head, lowering the stage to the stage height, and moving the mounting head which holds the component downward from the reference height position to the target movement height to mount the held component on the substrate or the already mounted component.

According to the component mounting apparatus of the first aspect and the component mounting method of the third aspect of the present invention, as the number of already mounted components, i.e. the number of layers of components already mounted on the substrate, increases, the amount by which the mounting head which holds the component to be mounted next is moved downward toward the stage is automatically adjusted. As a result, a plurality of components can be stack-mounted continuously, and thus the stacked mounting can be executed efficiently.

According to the component mounting apparatus of the second aspect and the component mounting method of the fourth aspect of the present invention, the greater the number of already mounted components, i.e. the greater the number of layers of components already mounted on the substrate, the more the stage is lowered, thereby the mounting height position is automatically kept constant. As a result, a plurality of components can be stack-mounted continuously, and thus the stacked mounting can be executed efficiently. Further, because the mounting height is kept constant, the work distance between the component and a recognition camera disposed between the mounting head and the component is kept constant. As a result, the recognition camera can execute position recognition of the already mounted component with high precision, and thus more highly precise mounting on the already mounted component can be realized.

DETAILED DESCRIPTION OF THE INVENTION

First Embodiment

Next, embodiments of the present invention will be described in detail with reference to the attached drawings.

Figure 5A:
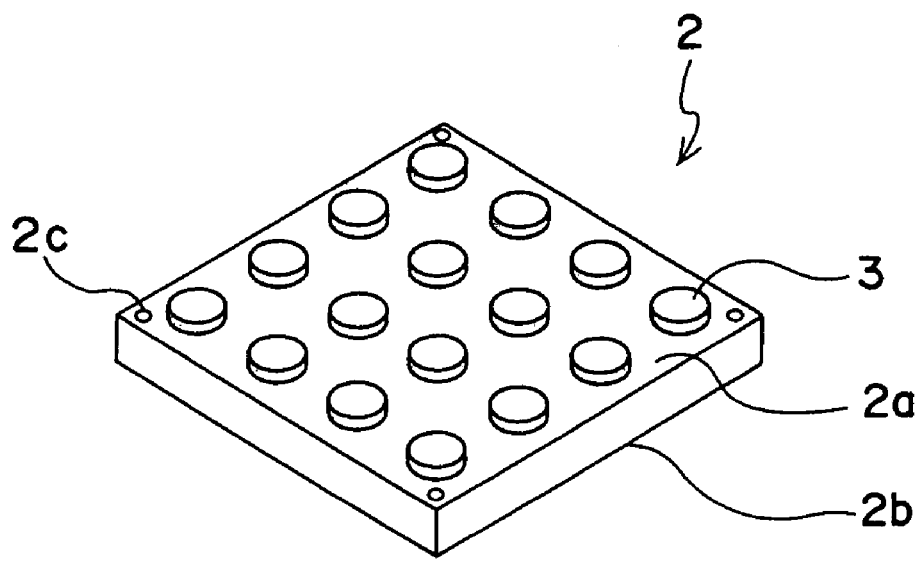
FIG. 5A is a perspective view of an IC chip viewed from a sucked surface side.
Figure 5B:
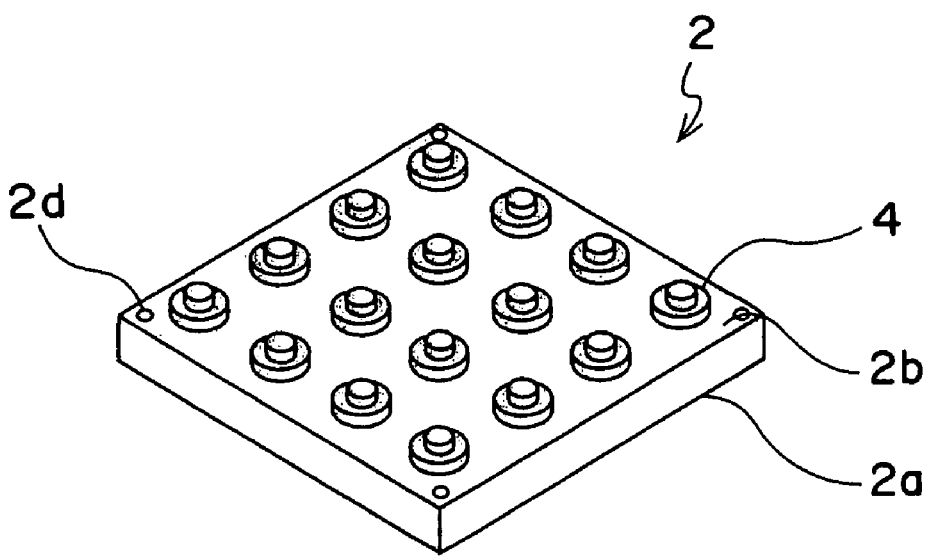
FIG. 5B is a perspective view of the IC chip viewed from a mounted surface side.
Figure 6:
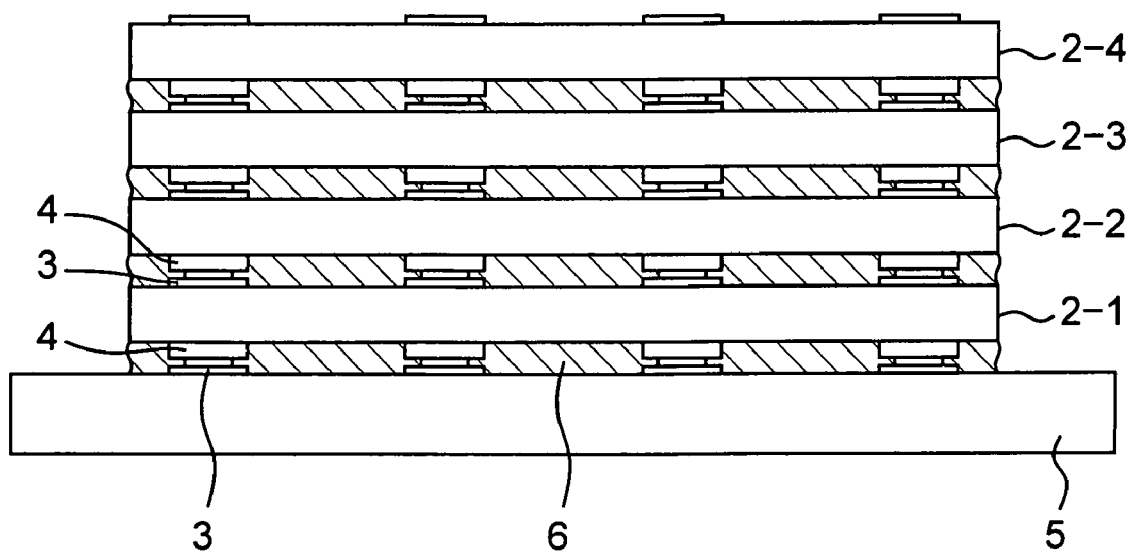
FIG. 6 is a partial sectional view showing an example of stack-mounted IC chips.

FIGS. 1 to 4 show a component mounting apparatus 1 according to a first embodiment of the present invention. This component mounting apparatus 1 is for carrying out or executing stacked mounting in which a plurality of IC chips (components) are mounted on a substrate in stack manner or so as to be stacked on each other. Referring to FIGS. 5A and 5B, each IC chip (chip) 2 has a plurality of pads (e.g. Au pads) 3 provided on one surface (a sucked surface) 2a thereof, and has a plurality of bumps (e.g. Au bumps) 4 provided on the other surface (a mounted surface) 2b thereof. FIG. 6 shows an example of a plurality of such chips 2 stack-mounted on a substrate 5. As shown in FIG. 6, the pads 3 are also provided on the substrate 5. A first layer chip 2-1 is mounted on the substrate 5, and a second layer chip 2-2 is mounted on the first layer chip 2-1. In the present example, a total of four chips 2-1 to 2-4 are stack-mounted. The bumps 4 on the first layer chip 2-1 are connected to the pads 3 on the substrate 5. Further, the bumps 4 on each of the second and subsequent layer chips 2-2 to 2-4 are connected to the pads 3 on the chip 2 on which each chip is mounted. A liquid material 6 such as underfill is applied into the gap between the substrate 5 and the first layer chip 2-1, and the gaps between the chips 2-1 to 2-4.

Figure 1:
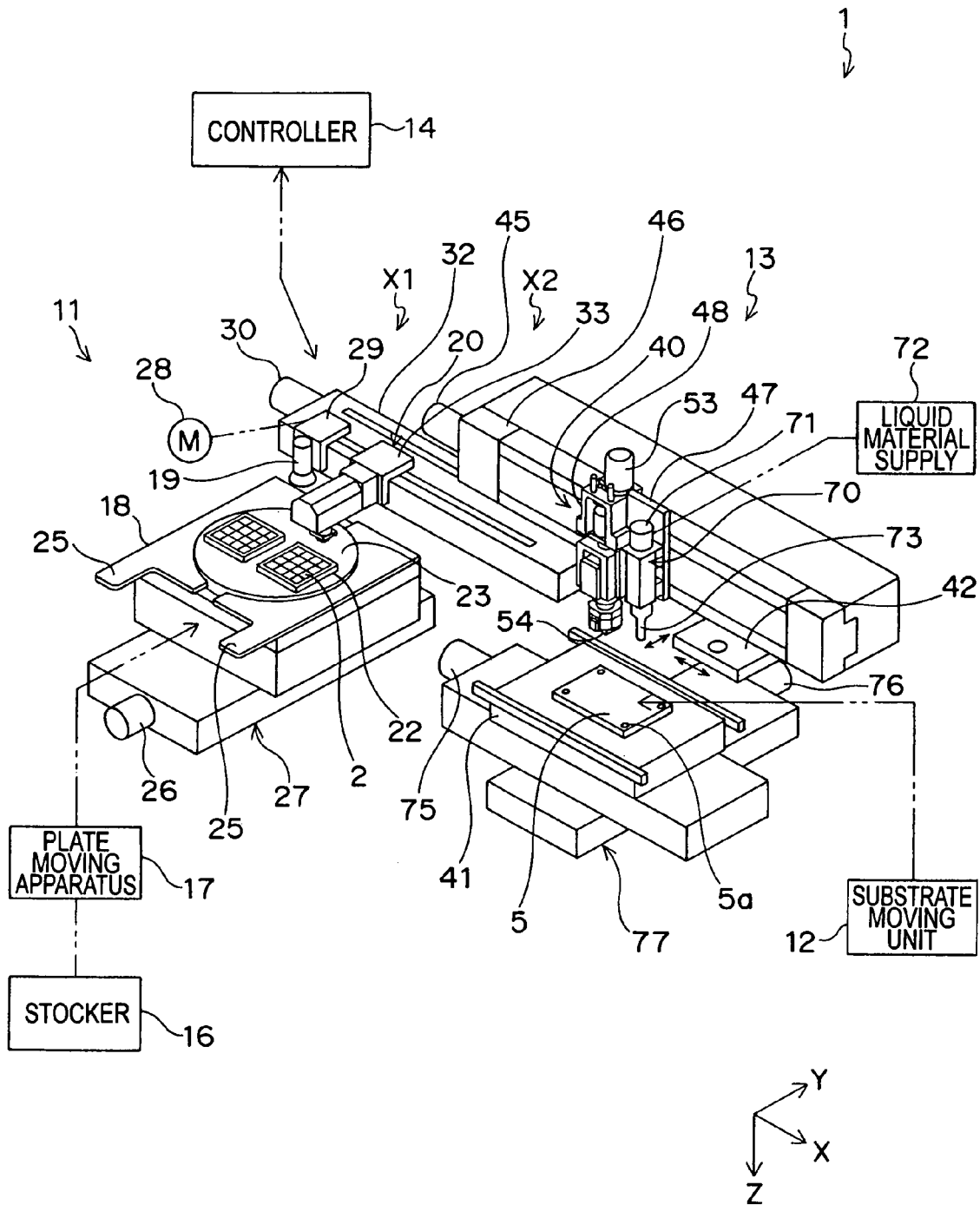
FIG. 1 is a perspective view of a component mounting apparatus according to a first embodiment of the present invention.

Referring to FIG. 1, the component mounting apparatus 1 has a component supply unit 11 that supplies the chips 2, a substrate moving unit 12 that moves the substrate 5, and a mounting unit 13 that executes an operation of stack-mounting the chips 2 on the substrate 5. Further, the component mounting apparatus 1 has a controller 14 for controlling operation of the component supply unit 11, substrate moving unit 12, and mounting unit 13.

The component supply unit 11 has a stocker 16, a plate moving apparatus 17, a plate positioning apparatus 18, a recognition camera 19, and a component transfer head apparatus 20.

Accommodated in the stocker 16 are a plurality of plates 23 each having trays 22 on which a plurality of the chips 2 are removably arranged.

The plate moving apparatus 17 takes out the trays 23 from the stocker 16 and moves the trays 22 to the plate positioning apparatus 18.

The plate positioning apparatus 18 has a pair of plate pushing bodies 25 that can be raised and lowered, and a supporting mechanism (not shown) disposed below the plate pushing bodies 25. When the plate pushing bodies 25 are in a raised position, a plate 23 can be put into or removed from a gap between the plate pushing bodies 25 and the supporting mechanism by the plate moving apparatus 17. On the other hand, when the plate pushing bodies 25 are in a lowered position, the plate 23 is pinched between the plate pushing bodies 25 and the supporting mechanism, thereby the plate 23 is held by the plate positioning apparatus 18. The plate positioning apparatus 18 can be moved in a Y-direction by a Y-axis robot 27 having a driving motor 26.

The recognition camera 19 is disposed above the plate positioning apparatus 18. The recognition camera 19 is provided on an X-axis robot 29 having a driving motor 28, and can thus be moved in an X-direction. The recognition camera 19 optically recognizes a position of each chips 2 on the plate 23 held by the plate positioning apparatus 18.

Figure 2A:
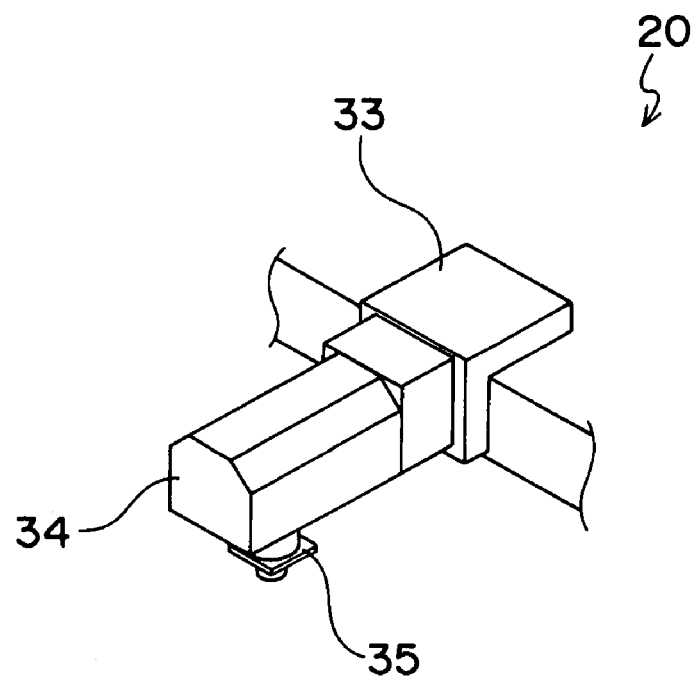
FIG. 2A is a perspective view of a component transferring apparatus with a reversing head directed downward.
Figure 2B:
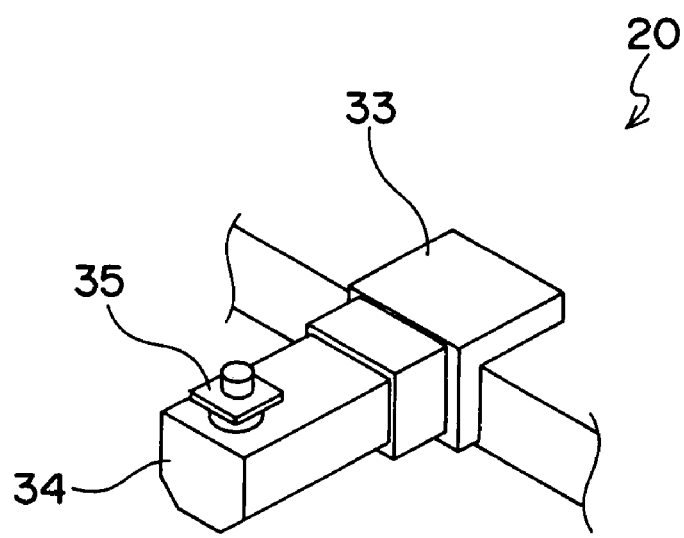
FIG. 2B is a perspective view of the component transferring apparatus with the reversing head directed upward.

The component transfer head apparatus 20 has an X-axis robot 32 having a driving motor 30 and moving a head frame 33 in the X-direction by this X-axis robot 32. A range of movement in the X-direction of the head frame 33 extends from a position corresponding to the plate positioning apparatus 18 (a chip handling position X1) to a position where the chip 2 is transferred or handed over to a mounting head apparatus 40 as described below (a chip handover position X2). Referring to both FIGS. 2A and 2B, a reversing head 34 is provided on the head frame 33. The reversing head 34 has a suction nozzle 35 that releasably sucks and holds the chip 2. Furthermore, the reversing head 34 moves the suction nozzle 35 upward and downward in an axial direction of the suction nozzle 35. The reversing head 34 also rotates the suction nozzle 35 around a centre of rotation extending in the Y-direction in the drawings, which is a direction approximately orthogonal to the axis of the suction nozzle 35. The suction nozzle 35 can thus be set to have either a vertically downward attitude as shown in FIG. 2A or a vertically upward attitude as shown in FIG. 2B.

The substrate moving unit 12 executes supply and carry-out of the substrate 5 with respect to the component mounting apparatus 1. Specifically, the substrate moving unit 12 has a loader for supplying the substrate 5 into the apparatus from outside the apparatus, a substrate carry-in apparatus that conveys in the substrate 5 from the loader onto a stage 41 described below, an unloader that discharges the substrate 5 on which chips 2 have been mounted from inside the apparatus to outside the apparatus, and a substrate carry-out apparatus that conveys the substrate 5 on which the chips 2 have been mounted from the stage 41 to the unloader.

The mounting unit 13 has the mounting head apparatus 40, the stage 41, and a double-field-of-view recognition camera 42.

The mounting head apparatus 40 has a carriage 47 that can be moved forward and backward in the X-direction by an X-axis robot 46 operated by a motor 45. A mounting head 48 is installed on the carriage 47.

Figure 3:
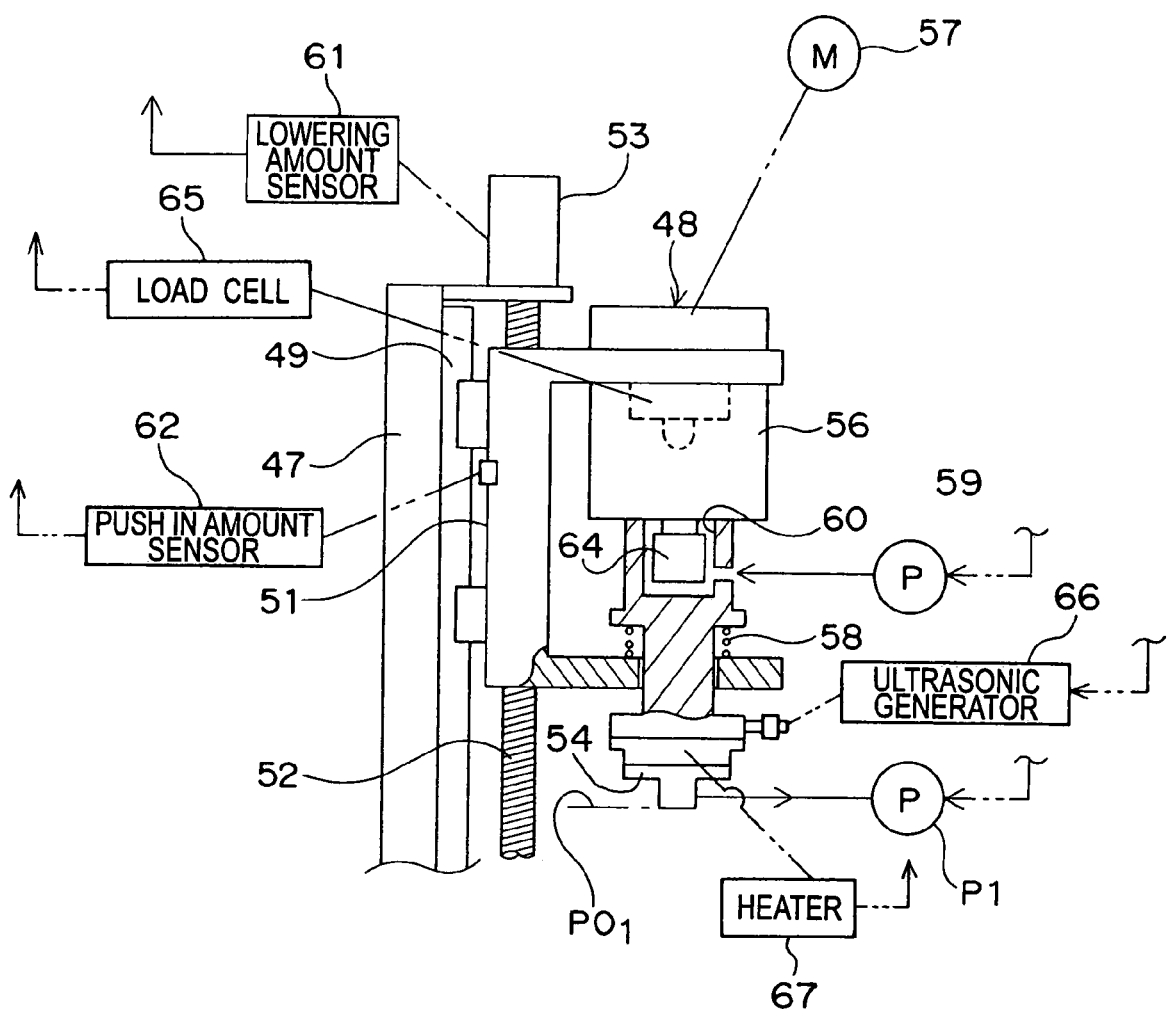
FIG. 3 is a partial enlarged view of a mounting head.

Referring also to FIG. 3, a linear motion guide 49 that extends in the vertical direction (the Z-direction) is arranged on the carriage 47, and a base 51 of the mounting head 48 is supported on the carriage 47 so as to be movable in the vertical direction along the linear motion guide 49. Further, an internal screw thread that extends in the vertical direction and into which a ball screw 52 screws is formed in the base 51. When the ball screw 52 is rotatably driven by a motor 53, the mounting head 48 is moved upward and downward according to a rotational direction of the ball screw 52. The position to which the mounting head 48 is raised/lowered, specifically the movement height from a first reference height position $HB_1$ described below, is detected by a lowering amount sensor 61.

The mounting head 48 has a suction nozzle (holding portion) 54 that releasably holds a chip 2 through a vacuum suction force from a vacuum pump P1. Further, the mounting head 48 has a nozzle supporting portion (base portion) 56 that supports the suction nozzle 54. The suction nozzle 54 can be rotated relative to the nozzle supporting portion 56 about the axis of the suction nozzle 54 (so-called θ rotation) by a motor 57 built into the nozzle supporting portion 56. Further, the suction nozzle 54 can be moved upward and downward in the vertical direction (the direction of the first reference height position $HB_1$ described below) relative to the nozzle supporting portion 56. A spring 58 that urges the suction nozzle 54 upward in the vertical direction is also provided. Further, a fluid passage 60 for supplying air therethrough from an air supply 59 is provided at a base end of the suction nozzle 54. In a state where a load is not acting on a tip end of the suction nozzle 54, the tip end of the suction nozzle 54 is in an initial position $PO_1$ as shown in FIG. 3. Upon a vertically upward load acting on the suction nozzle 54 via the held chip 2, the suction nozzle 54 moves vertically upward relative to the nozzle supporting portion 56 against the air pressure in the fluid passage 60. This amount of movement of the suction nozzle 54 relative to the nozzle supporting portion 56 is detected by a push in amount sensor 62.

Furthermore, the mounting head 48 has a load cell 65 that detects the load acting on the suction nozzle 54 via a piston 64 in the fluid passage 60, and an ultrasonic generator 66 and a heater 67 for supplying ultrasonic oscillation energy and thermal energy via the chip 2 held by the suction nozzle 54 through suction into the liquid material 6 or a joint between a pad 3 and a bump 4.

The carriage 47 of the mounting head apparatus 40 is provided with, in addition to the mounting head 48, an application head 70 for applying the liquid material 6 such as underfill onto the substrate 5 or the chip 2. The application head 70 can be moved upward and downward relative to the carriage 47 by a motor 71. The liquid material 6 supplied from a liquid material supply source 72 is applied onto the substrate 5 or the chip 2 by a vertically downward application nozzle 73 provided in the application head 70.

A suction hole is provided in the stage 41, so that the substrate 5 can be releasably held on an upper surface of the stage 41 by a vacuum suction mechanism (not shown). Further, a heater for heating the substrate is built into the stage 41. Furthermore, the stage 41 is installed on an XY robot 77 having X- and Y-direction driving motors 75 and 76. The stage 41 can thus be moved in the X- and Y-directions. However, in this embodiment, the vertical direction position of the stage 41 is fixed.

The vertical direction position of the double-field-of-view recognition camera 42 is set between those of the stage 41 and the mounting head 48, thereby the double-field-of-view recognition camera 42 executes optical recognition on both the chip 2 held on the mounting head 48 and the substrate 5 side on the stage 41. Further, the double-field-of-view recognition camera 42 can move in the X-direction and the Y-direction.

Next, description will be given of operation of the component mounting apparatus 1 from the chip 2 being picked up from the tray 22 of the plate 23 held by the plate positioning apparatus 18, up to being mounted on a substrate 5 held on the stage 41 or another chip 2 already mounted on the substrate 5.

First, the Y-axis robot 27 and the X-axis robot 32 are operated based on recognition results by the recognition camera 19, so as to align the suction nozzle 35 of the component transfer head apparatus 20 above the desired chip 2. Next, the suction nozzle 35 is moved downward toward the chip 2, and then the chip 2 is sucked and held by the suction nozzle 35. The mounted surface 2b of the chip 2 is held by the suction nozzle 35. After that, the suction nozzle 35 is moved upward and away from the plate 23. Next, the reversing head 34 is moved by the X-axis robot 32 from the chip handling position X1 to the chip handover position X2. Further, the carriage 47 of the mounting head 48 is moved to the chip handover position X2 by the X-axis robot 46. At the chip handover position X2, the mounting head 48 is positioned above the reversing head 34.

Next, the suction nozzle 35 is switched by the reversing head 34 from the downward attitude shown in FIG. 2A to the upward attitude shown in FIG. 2B, so that the sucked surface 2a of the chip 2 held by the suction nozzle 35 is turned upward. The mounting head 48 is then moved downward toward the reversing head 34 by the motor 53. Once the suction nozzle 54 of the mounting head 48 contacts the sucked surface 2a of the chip 2 held by the reversing head 34, the vacuum pump P1 is operated so that the suction nozzle 54 starts sucking the chip 2 thereto, and then the suction of the chip 2 by the suction nozzle 35 of the reversing head 34 is released. As a result, the chip 2 is handed over from the reversing head 34 to the mounting head 48. The reversing head 34 then returns to the chip handling position X1 to execute operation for picking up the next chip 2.

The mounting head 48 to which the chip 2 has been handed over from the reversing head 34 is moved above the stage 41 by the X-axis robot 46. The X-axis robot 46 and the XY robot 77 are then operated based on recognition results by the double-field-of-view recognition camera 42, so as to align the application nozzle 73 of the application head 70 relative to the substrate 5 or the already mounted chip 2. The application head 70 is then moved downward by the motor 71, and then the liquid material 6 from the liquid material supply source 72 is applied from the application nozzle 73 onto the substrate 5 or the already mounted chip 2.

Next, the X-axis robot 46 and the XY robot 77 are operated based on recognition results by the double-field-of-view recognition camera 42, so as to align the chip 2 held by the suction nozzle 54 of the mounting head 48 relative to the substrate 5 or the already mounted chip 2. The motor 53 is then operated so as to move the mounting head 48 downward toward the stage 41, and once the mounted surface 2b of the chip 2 held by the suction nozzle 54 has contacted the substrate 5 or the already mounted chip 2, the pad 3 and the bump 4 are joined together, and further the liquid material 6 is solidified, through ultrasound generated by the ultrasonic generator 66 and heat generated by the heater 67.

The above operations are repeated, thereby a plurality of chips 2 is stacked on the substrate as to form stages or layers.

Next, a detailed description will be given of control of the mounting unit 13 executed by the controller 14 for realizing the stacked mounting.

First, parameters used in the control will be described with reference to FIGS. 8A to 8D.

A thickness of each chip 2 be represented by the symbol $PT_n$. Here, the variable "n" indicates integers from "1" upwards, and represents which layer the chip constitutes from the substrate 5. For example, $PT_1$ represents the thickness of a first layer chip 2 (chip 2-1) directly mounted on the substrate 5. Further, $PT_2$ represents the thickness of a second layer chip 2 (chip 2-2) mounted on the first layer chip 2-1. The maximum value of "n" is represented by $n_{max}$. Thus, the chips of $n_{max}$ from the chip 2-1 to the chip $2\text{-}n_{max}$ are stack-mounted on the substrate 5.

As described above, in the present embodiment, the height of the stage 41 is fixed, and the mounting head 48 is positioned above the stage 41. The mounting head 48 is moved downward from a certain height position (home position) above the stage 41 toward the stage 41. A height position of a lower end of the suction nozzle 54 of the mounting head 48 in the home position is defined as a first reference height position $HB_1$.

Similarly to the mounting head 48, the application head 70 is also moved downward from a certain height position (home position) above the stage 41 toward the stage 41. However, the home position of the application head 70 is below the above-mentioned home position of the mounting head 48 by a distance "a". The height position of a lower end of the application nozzle 73 of the application head 70 in the home position is defined as a second reference height position $HB_2$.

Each of mounting reference heights $H_n$ (n=1 to $n_{max}$) corresponds to a distance in the vertical direction from the first reference height position $HB_1$, to the substrate 5 or the already mounted chip 2. In the present embodiment, the basis for each mounting reference height $H_n$ is the first reference height position $HB_1$, with downward in the vertical direction being taken as positive.

Each of target movement heights (first target movement height) $ZTAG_n$ (n=1 to $n_{max}$) is a reference value of a lowering amount when the mounting head 48 holding the chip 2 is moved downward toward the stage 41. Further, each of another target movement heights (second target movement height) $DZTAG_n$ (n=1 to $n_{max}$) is a reference value of a lowering amount when the application nozzle 73 is moved downward toward the stage 41. In the present embodiment, the bases for the target movement heights $ZTAG_n$ and $DZTAG_n$ are the first and second reference height positions $HB_1$ and $HB_2$ respectively, with downward in the vertical direction being taken as positive.

Figure 4:
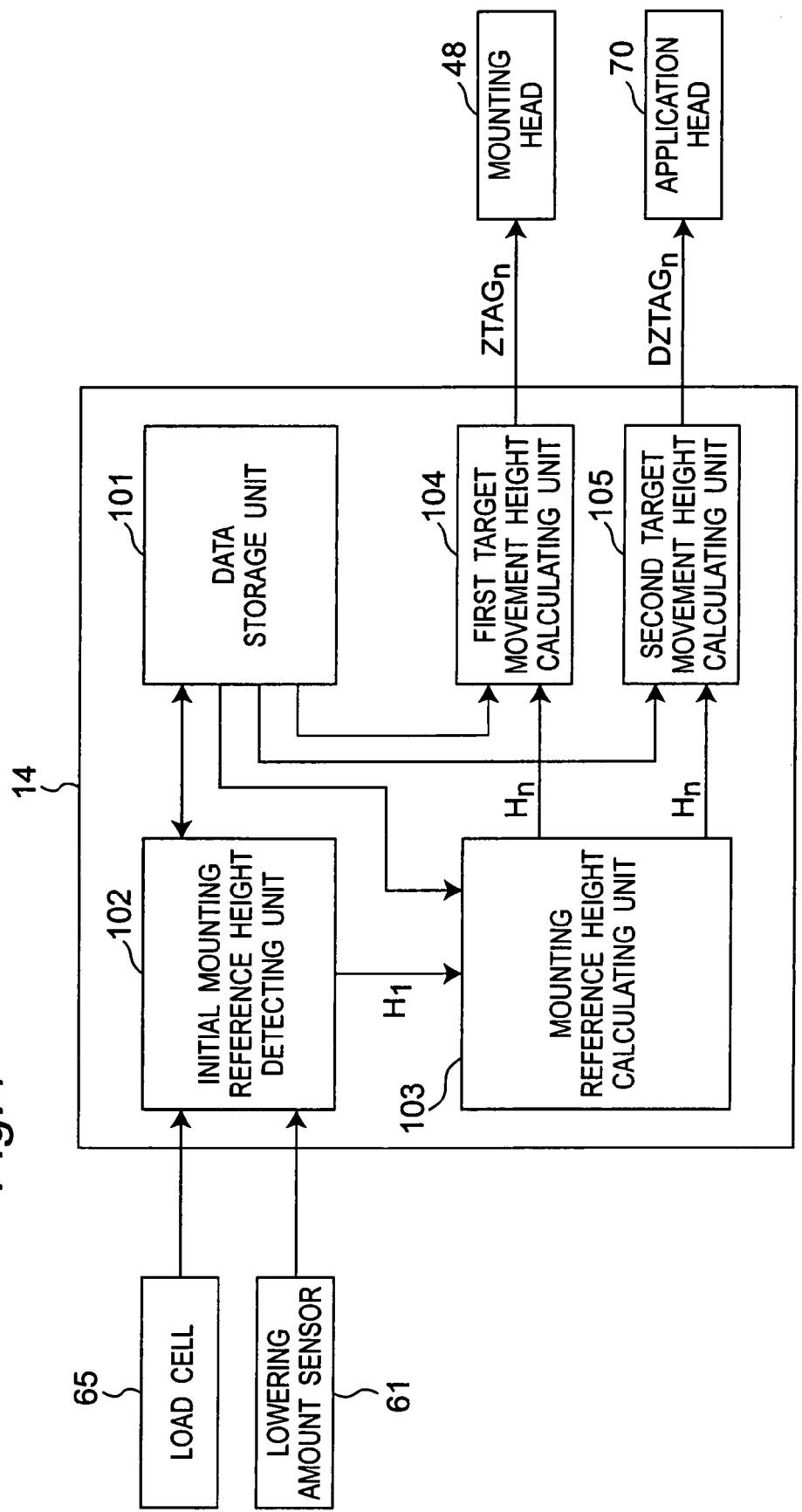
FIG. 4 is a block diagram of a controller in the first embodiment.

FIG. 4 shows a structure of the controller 14 for realizing the stacked mounting. First, various values necessary for the control including the thicknesses $PT_n$ of the chips 2 in the various layers, and the first and second reference height positions $HB_1$ and $HB_2$ are stored in advance in a data storage unit 101. An initial mounting reference height detecting unit 102 detects the mounting reference height $H_n$ in a state where no chips 2 have yet been mounted on the substrate 5 held on the stage 41 (an initial mounting reference height $H_1$) based on inputs from the load cell 65 and the lowering amount sensor 61. Further, a mounting reference height calculation unit 103 calculates the mounting reference height $H_n$ for each stage based on the initial mounting reference height $H_1$ detected by the initial mounting reference height detecting unit 102 and the various values stored in the data storage unit 101. Furthermore, a first target movement height calculation unit 104 calculates the target movement height $ZTAG_n$ for the mounting head 48 for each of the layers based on the mounting reference height $H_n$ calculated by the mounting reference height calculation unit 103 and the values stored in the data storage unit 101, and outputs these calculated target movement heights $ZTAG_n$ to the mounting head 48. Further, a second target movement height calculation unit 105 calculates the target movement height $DZTAG_n$ for the application head 70 for each of the layers based on the mounting reference height $H_n$ calculated by the mounting reference height calculation unit 103 and the values stored in the data storage unit 101.

Figure 7:
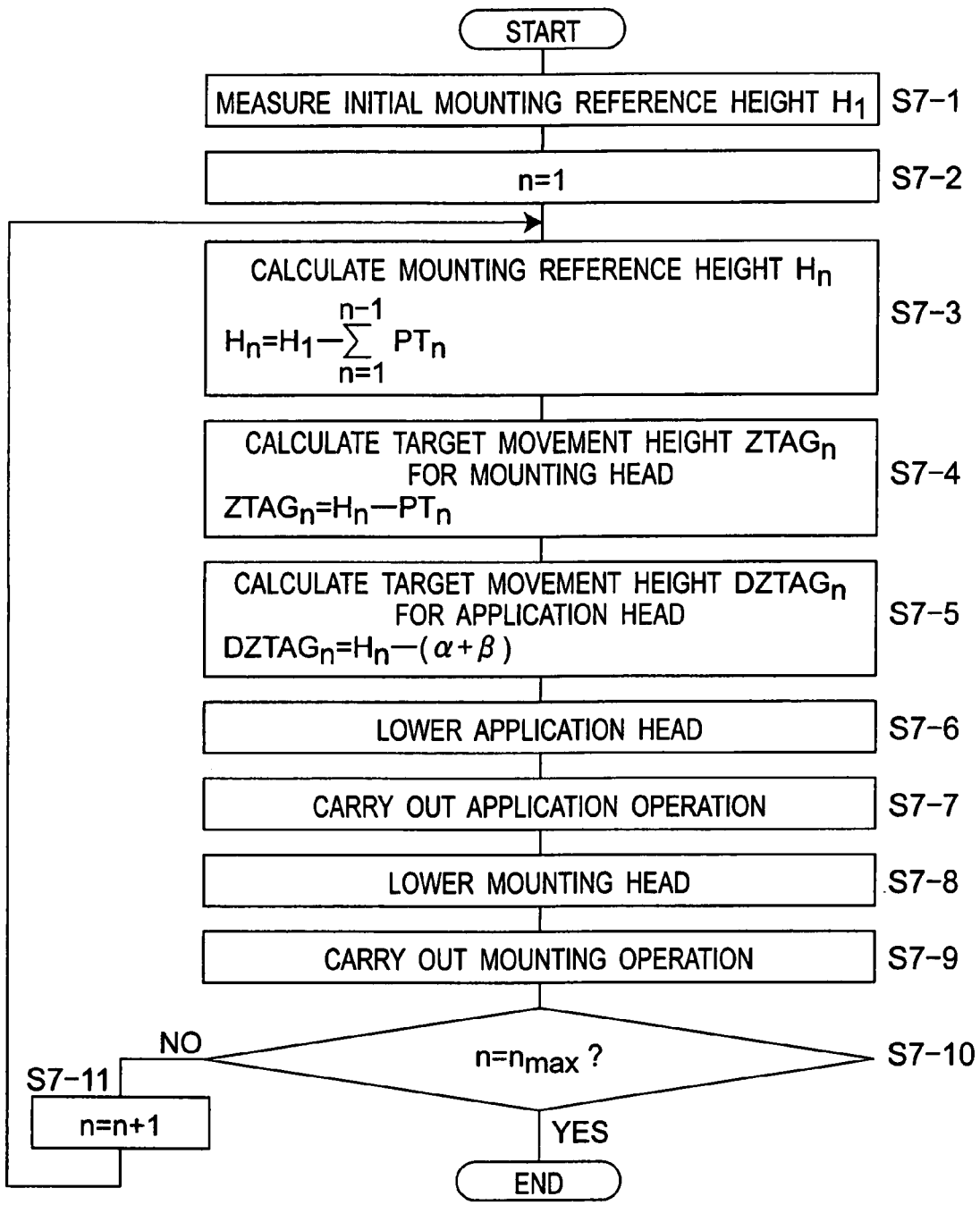
FIG. 7 is a flowchart for explaining operation of the component mounting apparatus according to the first embodiment.

Next, the operation of the controller 14 and the mounting unit 13 will be described with reference to FIG. 7. First, at step S7-1, measurement of the initial mounting reference height $H_1$ is executed. Specifically, the mounting head 48 in a state where no chip 2 is held on the suction nozzle 54 is moved downward toward the substrate 5 (on which no chips 2 have yet been mounted) on the stage 41. The initial mounting reference height detecting unit 102 detects contact of the suction nozzle 54 to the substrate 5 by the change in the load detected by the load cell 65, and then detects the initial mounting reference height $H_1$ by the input value from the lowering amount sensor 61 at this timing. The detected initial mounting reference height $H_1$ is stored in the data storage unit 101.

Steps S7-2 to S7-11 comprise processing for actually mounting the chips 2 on the substrate 5 or the already mounted chip 2. First, at step S7-2, the variable "n" indicating the layer number is set to "1".

At step S7-3, the mounting reference height calculation unit 103 calculates the mounting reference height $H_n$ based on following formula (1).

$$H_n = H_1 - \sum_{n=1}^{n-1} PT_n \tag{1}$$

Here, $H_n$ represents the mounting reference height for the $n^{th}$ layer, and $H_1$ represents the initial mounting reference height detected at step S7-1. Further, the second term on the right side of the formula represents the sum of the thicknesses of the chips 2 from the first layer to the current layer. As described before, the thicknesses $PT_n$ of the chips 2 in the various layers have been stored in the data storage unit 101.

Next, at step S7-4, the first target movement height calculation unit 104 calculates the target movement height $ZTAG_n$ for the mounting head 48 based on following formula (2).

$$ZTAG_n = H_n - PT_n \tag{2}$$

Here, $ZTAG_n$ represents the target movement height for the mounting head 48 when mounting the $n^{th}$ layer chip 2, $H_n$ represents the mounting reference height for the $n^{th}$ layer calculated at step S7-3, and $PT_n$ represents the thickness of the $n^{th}$ layer chip 2.

At step S7-5, the second target movement height calculation unit 105 calculates the target movement height $DZTAG_n$ for the application head 70 based on following formula (3).

$$DZTAG_n = H_n - (\alpha + \beta) \tag{3}$$

Here, $H_n$ represents the mounting reference height for the $n^{th}$ layer calculated at step S7-3, and "$\alpha$" represents the difference between the first reference height position $HB_1$ and the second reference height position $HB_2$, i.e. the distance between the lower end of the suction nozzle 54 and the lower end of the application nozzle 73. Further, "$\beta$" represents an offset for preventing interference between the application nozzle 73 and the substrate 5 or the chip 2.

At step S7-6, the application head 70 is moved downward toward the stage 41 by the target movement height $DZTAG_n$ calculated at step S7-5. After that, at step S7-7, an operation of application by the application head 70 is executed. The liquid material 6 is applied onto the substrate 5 or the already mounted chip 2 from the application nozzle 73.

At step S7-8, the mounting head 48 is moved downward to the target movement height $ZTAG_n$ calculated at step S7-4. Generally, upon lowering by the target movement height $ZTAG_n$, the chip 2 held by the suction nozzle 54 of the mounting head 48 will contact the substrate 5 or the already mounted chip 2. However, due to an error in the thickness of the chip 2 or the like, there is a possibility that the held chip 2 will contact the substrate 5 or the already mounted chip 2 before the mounting head 48 has been lowered by the target movement height $ZTAG_n$. On the other hand, there is also a possibility that the held chip 2 will not contact the substrate 5 or the already mounted chip 2 in spite of that the mounting head 48 is lowered by the target movement height $ZTAG_n$. The controller 14 thus monitors occurrence of contact of the held chip 2 with the substrate 5 or the already mounted chip 2 through the load detected by the load cell 65. If the held chip 2 contacts the substrate 5 or the already mounted chip 2 before the target movement height $ZTAG_n$ is reached, then the controller 14 stops the downward movement of the mounting head 48. On the other hand, if the held chip 2 does not contact the substrate 5 or the already mounted chip 2 in spite of that the target movement height $ZTAG_n$ is reached, then the controller 14 continues the lowering of the mounting head 48 until the contact is detected.

Next, at step S7-9, the chip 2 held by suction on the suction nozzle 54 of the mounting head 48 ($n^{th}$ layer chip) is mounted on the substrate 5 or the already mounted chip 2.

After that, at step S7-10, if "$n=n_{max}$" is not true, i.e. if mounting of the final layer chip 2 has not been completed, then the variable "n" is incremented by 1 at step S7-11, and the processing of steps S7-3 to S7-9 is repeated.

The operation of the controller 14 and the mounting unit 13 will be described in more detail with reference to FIGS. 8A to 8D.

Figure 8A:
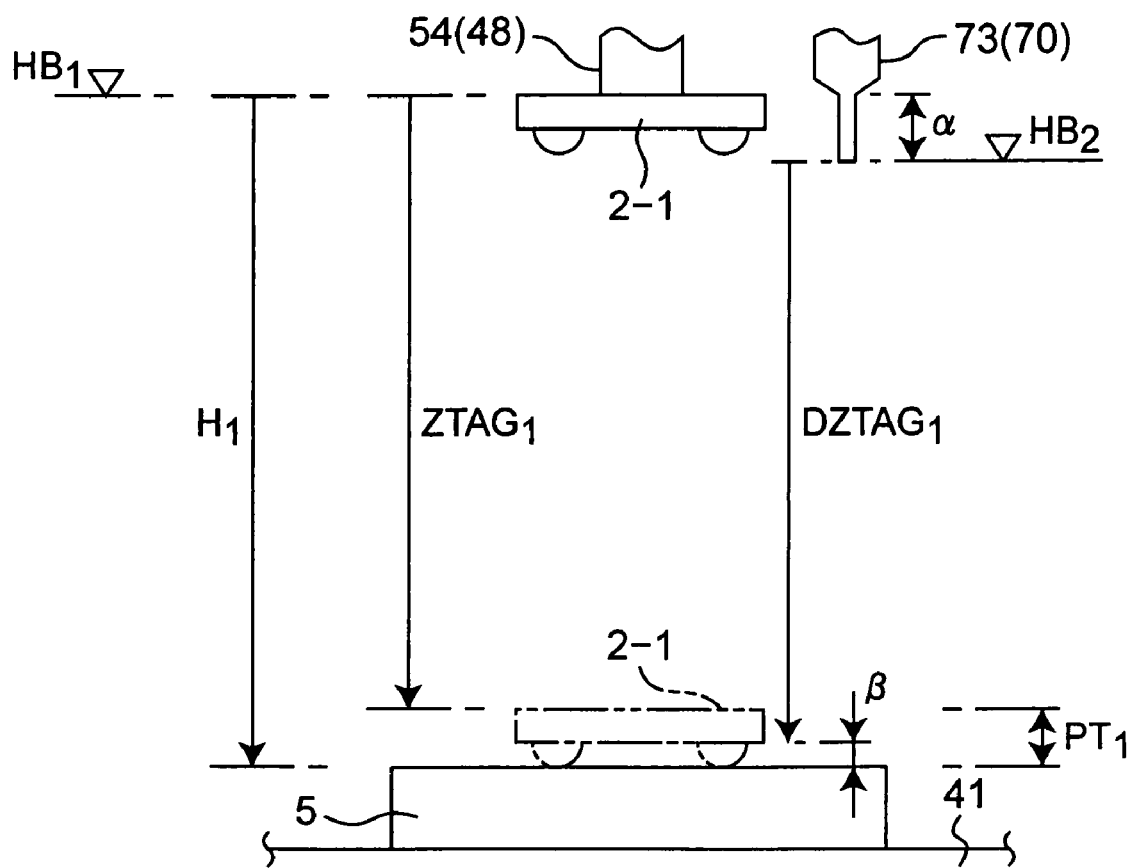
FIG. 8A is a schematic view for explaining first layer mounting in the first embodiment.

FIG. 8A shows a state before mounting the first layer chip 2-1. As shown in FIG. 8A, the mounting reference height $H_1$ for the first layer is the distance from the first reference height position $HB_1$ to the substrate 5 held on the stage 41. Further, the target movement height $ZTAG_1$ for the mounting head 48 for the first layer is the difference obtained by subtracting the thickness $PT_1$ of the first layer chip 2-1 from the initial mounting reference height $H_1$. Furthermore, the target movement height $DZTAG_1$ for the application head 70 for the first layer is set to a value such that the lower end of the application nozzle 73 is positioned above the substrate 5 by the offset $\beta$.

Figure 8B:
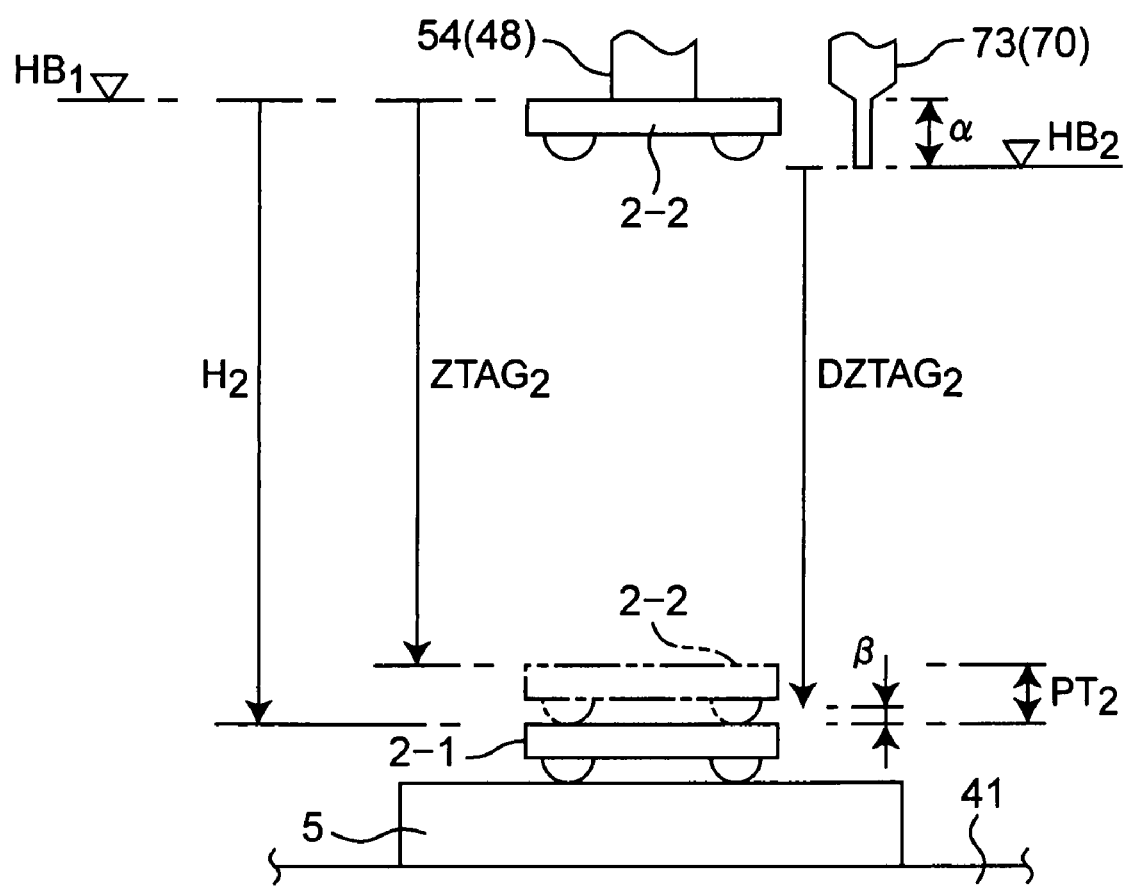
FIG. 8B is a schematic view for explaining second layer mounting in the first embodiment.
Figure 8C:
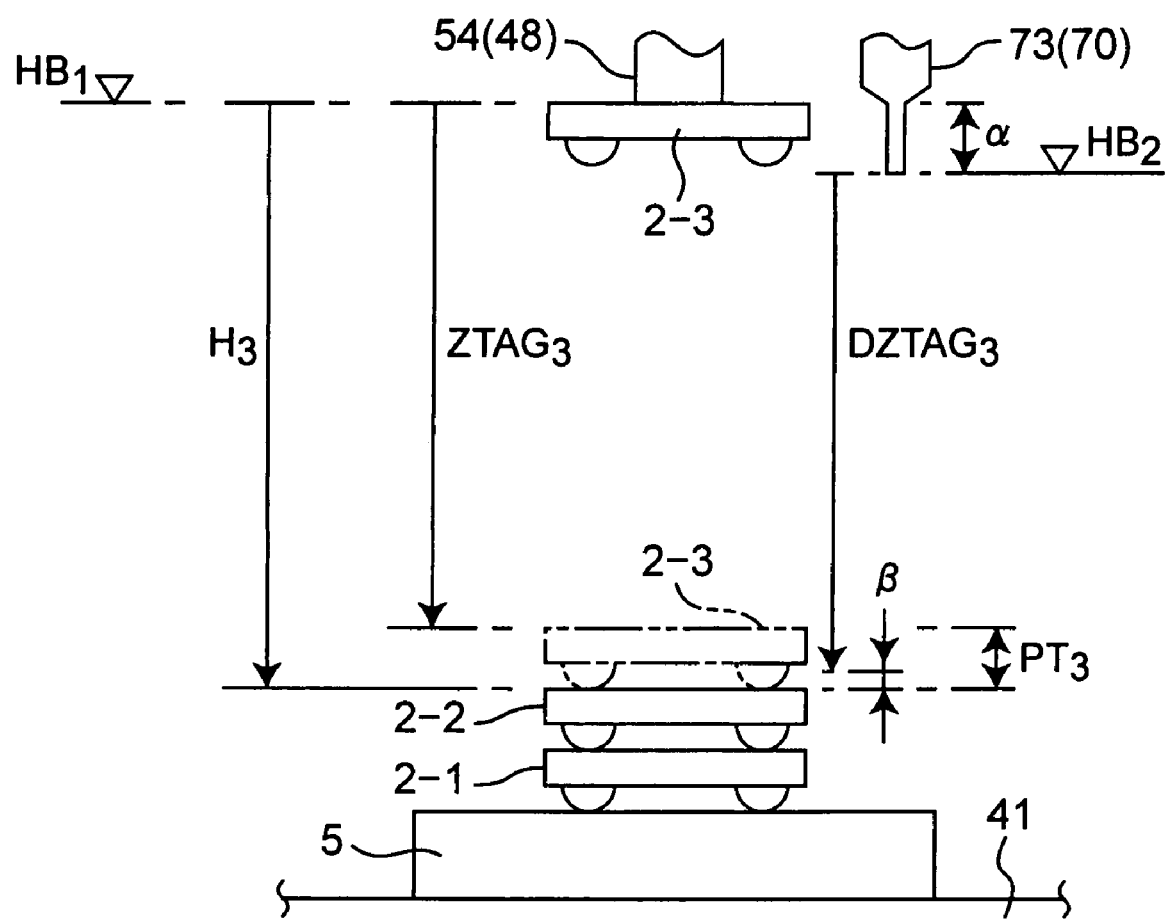
FIG. 8C is a schematic view for explaining third stage mounting in the first embodiment.

FIGS. 8B and 8C show respectively states before mounting the second and third layer chips 2-2 and 2-3. As shown in FIGS. 8B and 8C, each of the mounting reference heights $H_2$ and $H_3$ for the second and third layers corresponds to the distance from the first reference height position $HB_1$ to the first or second layer chip 2-1, 2-2 already mounted on the substrate 5. Further, each of the target movement heights $ZTAG_2$ and $ZTAG_3$ for the mounting head 48 for the second and third layers is the difference obtained by subtracting the thickness $PT_2$, $PT_3$ of the chip 2-2, 2-3 from the mounting reference height $H_2$, $H_3$. Furthermore, each of the target movement heights $DZTAG_2$ and $DZTAG_3$ for the application head 70 is set to a value such that the lower end of the application nozzle 73 is positioned above the already mounted chip 2-1, 2-2 by the offset $\beta$.

Figure 8D:
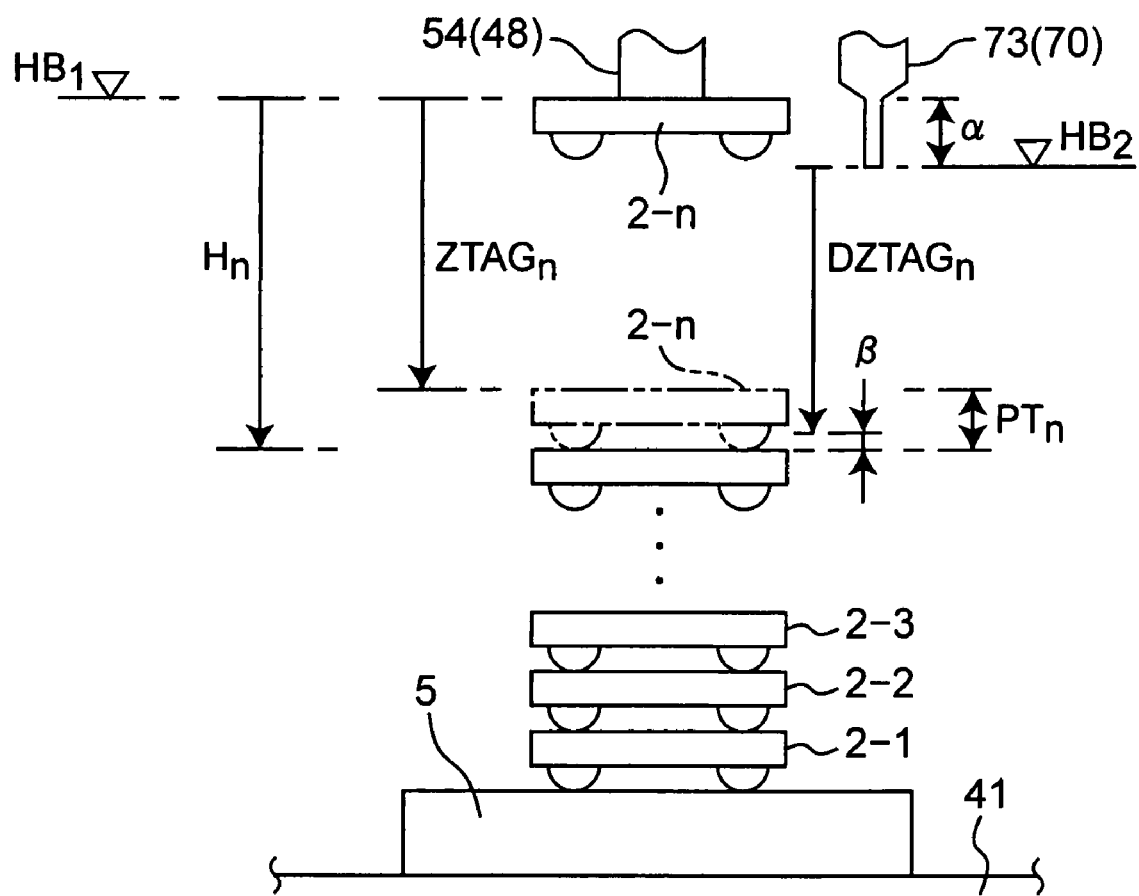
FIG. 8D is a schematic view for explaining $n^{th}$ stage mounting in the first embodiment.

FIG. 8D shows a state before mounting the $n^{th}$ layer chip 2-$n$. As shown in FIG. 8D, the mounting reference height $H_n$ for the $n^{th}$ layer is the distance from the first reference height position $HB_1$ to the substrate 5 or the already mounted chip 2 held on the stage 41. Further, the target movement height $ZTAG_n$ for the mounting head 48 for the $n^{th}$ layer is the difference obtained by subtracting the thickness $PT_n$ of the $n^{th}$ layer chip 2-$n$, i.e. the chip 2-$n$ to be currently mounted from the mounting reference height $H_n$. Furthermore, the target movement height $DZTAG_n$ for the application head 70 for the $n^{th}$ layer is set to the value such that the lower end of the application nozzle 73 is positioned above the substrate 5 by the offset "$\beta$".

Next, the alignment of a chip 2 relative to the substrate 5 or the already mounted chip 2 will be described in detail. As described above, when applying on the liquid material 6 using the application head 70, the controller 14 moves the application head 70 in the Y-direction and moves the XY robot 77 in the X-direction based on recognition results by the double-field-of-view recognition camera 42, so as to align the application nozzle 73 with the substrate 5 or the already mounted chip 2. Further, when mounting the chip 2 on the substrate 5 or the already mounted chip 2 using the mounting head 48, the controller 14 moves the mounting head 48 in the X-direction and moves the XY robot 77 in the X-direction and the Y-direction based on recognition results by the double-field-of-view recognition camera 42 so as to align the chip 2 held by the suction nozzle 54 with the substrate 5 or the already mounted chip 2. When mounting the chip 2 on the substrate 5 or the already mounted chip 2 using the mounting head 48, the controller 14 may alternatively not move the mounting head 48 in the X-direction or Y-direction, but rather move only the XY robot 77 in the X-direction or Y-direction based on the recognition results by the double-field-of-view recognition camera 42 so as to align the chip 2 held by the suction nozzle 54 with the substrate 5 or the already mounted chip 2.

When aligning the application nozzle 73 with the substrate 5 during mounting of the first layer chip 2-1 onto the substrate 5, the double-field-of-view recognition camera 42 recognize position identifying marks 5a provided on the substrate 5 (see FIG. 1), and the controller 14 executes the alignment based on the recognition results. Further, when aligning the first layer chip 2-1 held by the suction nozzle 54 with the substrate 5, the double-field-of-view recognition camera 42 recognizes the position identifying marks 5a provided on the substrate 5 and position identifying marks 2d provided on the mounted surface 2b of the first layer chip 2-1 held by the suction nozzle 54 (see FIG. 5B), and the controller 14 executes the aligning based on the recognition results.

Regarding what the double-field-of-view recognition camera 42 recognizes, i.e. based on what the aligning is executed, when executing the alignments during mounting of the second layer to $n_{max}{}^{th}$ layer chips 2-2 to 2-$n_{max}$, there are following three manners.

As a first manner, for the mounting of all of the second layer to $n_{max}{}^{th}$ layer chips 2-2 to 2-$n_{max}$, when aligning the application nozzle 73 with the already mounted chip 2, the double-field-of-view recognition camera 42 recognizes the position identifying marks 5a provided on the substrate 5, and the controller 14 executes the aligning based on the recognition results. Further, for all of the second layer to $n_{max}{}^{th}$ layer chips 2-2 to 2-$n_{max}$, when aligning the chip 2 held by the suction nozzle 54 with the already mounted chip 2, the double-field-of-view recognition camera 42 recognizes the position identifying marks 5a provided on the substrate 5 and the position identifying marks 2d provided on the mounted surface 2b of the chip 2 held by the suction nozzle 54, and the controller 14 executes the aligning based on the recognition results. By executing the alignments of the application nozzle 73 and the chip 2 to be mounted with the already mounted chip 2 based on the same position identifying marks 5a for all of the second $n_{max}{}^{th}$ layer chips 2-2 to 2-$n_{max}$, highly precise stacked mounting can be executed stably.

As a second manner, for the mounting of all of the second to $n_{max}{}^{th}$ layer chips 2-2 to 2-$n_{max}$, when aligning the application nozzle 73 with the already mounted chip 2, the double-field-of-view recognition camera 42 recognizes the position identifying marks 2c provided on the sucked surface 2a of the first layer (lowermost layer) chip 2-1 already mounted on the substrate 5 (see FIG. 5A), and the controller 14 executes the alignments based on the recognition results. Further, for all of the second to $n_{max}{}^{th}$ layer chips 2-2 to 2-$n_{max}$, when aligning the chip 2 held by the suction nozzle 54 with the already mounted chip 2, the double-field-of-view recognition camera 42 recognizes the position identifying marks 2c provided on the sucked surface 2a of the first layer (lowermost stage) chip 2-1 and the position identifying marks 2d provided on the mounted surface 2b of the chip 2 held by the suction nozzle 54, and the controller 14 executes the alignments based on the recognition results. By executing the alignments of the application nozzle 73 and the chip 2 to be mounted with the already mounted chip 2 based on the position identifying marks 2c on the same chip 2-1 for all of the second to $n_{max}{}^{th}$ layer chips 2-2 to 2-$n_{max}$, highly precise stacked mounting can be executed stably. In the case of adopting this second manner, it is necessary to set the area in plan view of the first layer chip 2-1 to be greater than that of the other chips 2-2 to 2-$n_{max}$ so that the position identifying marks 2c provided on the on the sucked surface 2a of the first layer chip 2-1 can always be in the field of view of the double-field-of-view recognition camera 42 during the stacked mounting.

As a third manner, for the mounting of all of the second to $n_{max}{}^{th}$ layer chips 2-2 to 2-$n_{max}$, when aligning the application nozzle 73 with the already mounted chip 2, the double-field-of-view recognition camera 42 recognizes the position identifying marks 2c provided on the sucked surface 2a of the already mounted chip 2 in the uppermost layer, and the controller 14 executes the alignment based on the recognition results. Further, for all of the second to $n_{max}{}^{th}$ layer chips 2-2 to 2-$n_{max}$, when aligning the chip 2 held by the suction nozzle 54 with the already mounted chip 2, the double-field-of-view recognition camera 42 recognizes the position identifying marks 2c provided on the sucked surface 2a of the already mounted chip 2 in the uppermost layer and the position identifying marks 2d provided on the mounted surface 2b of the chip 2 held by the suction nozzle 54, and the controller 14 executes the aligning based on the recognition results. For example, when mounting the second layer chip 2-2, the double-field-of-view recognition camera 42 recognizes the position identifying marks 2c provided on the sucked surface 2a of the first layer chip 2-1 already mounted on the substrate 5. Further, during the $n^{th}$ layer mounting, the double-field-of-view recognition camera 42 recognizes the position identifying marks 2c provided on the sucked surface 2a of the already mounted $(n-1)^{th}$ layer chip 2-$(n-1)$.

In the alignment of the application nozzle 73 or the chip 2 held by the suction nozzle 54, instead of the position identifying marks 2c, 2d or 5a, the double-field-of-view recognition camera 42 may alternatively recognize part(s) of a circuit pattern on the chip 2 or the substrate 5, or a corner/edge part(s) of the chip 2 or the substrate 5.

As described above, according to the component mounting apparatus 1 of the present embodiment, the greater the number of already mounted chips 2, i.e. the greater the number of layers of already mounted chips 2 on the substrate 5, the more the mounting reference height $H_n$ is raised up, and accompanying this the more the target movement height $ZTAG_n$ for the mounting head 48 is raised up so that the target movement height $ZTAG_n$ approaches the first reference height position $HB_1$. In other words, as the number of layers of chips 2 mounted on the substrate 5 increases, the amount by which the mounting head 48 which holds the chip to be mounted next is moved downward from the first reference height position $HB_1$ toward the stage 41 is automatically adjusted by the controller 14. The plural chips 2 can thus be stack-mounted continuously, and hence the stacked mounting can be executed efficiently.

Second Embodiment

Figure 9:
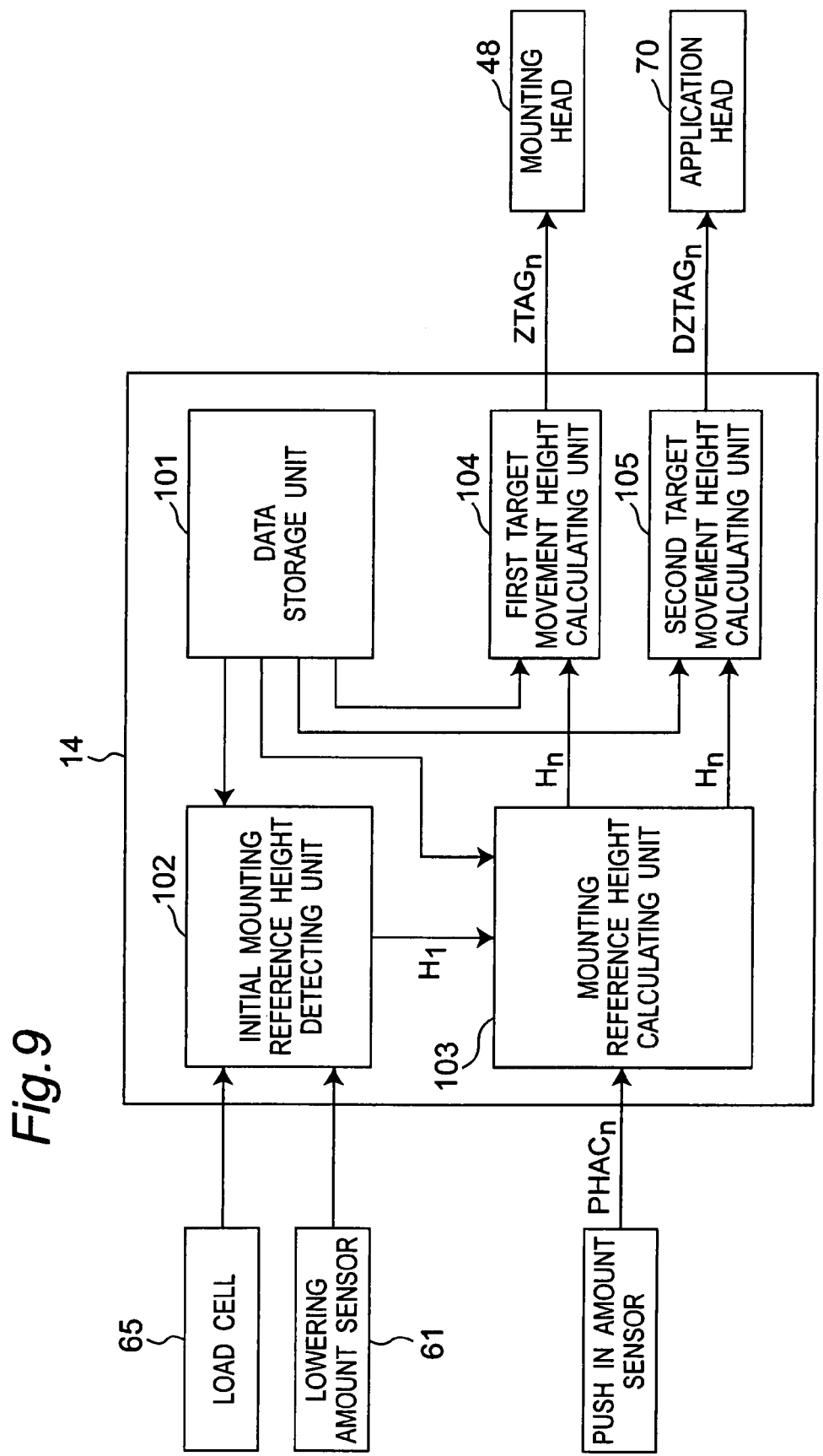
FIG. 9 is a block diagram showing a controller in a second embodiment of the present invention.

FIG. 9 shows the controller 14 in a second embodiment of the present invention. In the present embodiment, a set push in amount $PHSET_n$ for each stage is stored in the data storage unit 101. The set push in amount $PHSET_n$ is a set value for a distance by which the suction nozzle 54 is pushed into the nozzle supporting portion 56 vertically upward from the initial position $PO_1$ (see FIG. 3) caused by that the mounting head 48 is further lowered after the chip 2 held by the suction nozzle 54 has contacted the substrate 5 or the already mounted chip when the mounting head 48 holding a chip 2 on the suction nozzle 54 is lowered from the first reference height position $HB_1$ toward the substrate 5 or the already mounted chip 2. Further, the mounting reference height calculation unit 103 uses the set push in amount $PHSET_n$ and an actual push in amount $PHAC_n$, which is the actual measured value of the push in amount of the suction nozzle 54 as detected by the push in amount sensor 62, in the calculation of the mounting reference height $H_n$ for each layer. Furthermore, the first target movement height calculation unit 104 also uses the set push in amount $PHSET_n$ in the calculation of the target movement height $ZTAG_n$ for the mounting head 48 for each stage.

Figure 10:
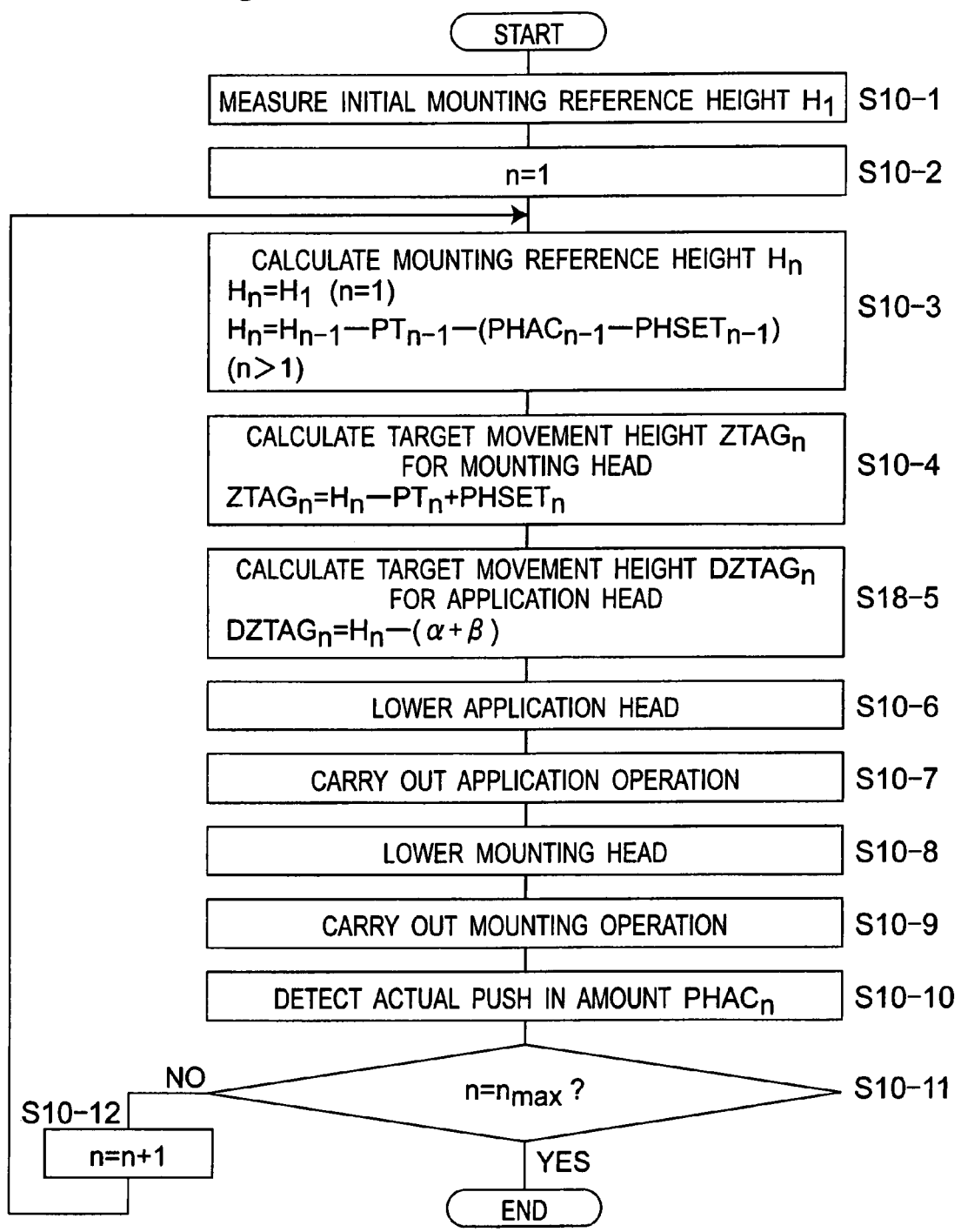
FIG. 10 is a flowchart for explaining operation of the component mounting apparatus according to the second embodiment.

The operation of the controller 14 and the mounting unit 13 will be described with reference to the flowchart of FIG. 10. Of steps S10-1 to S10-12, the processing at steps S10-1, S10-2, S10-5 to S10-9, S10-11 and S10-12 is the same as those in the corresponding steps in FIG. 7.

At step S10-3, the mounting reference height calculation unit 103 calculates the mounting reference height $H_n$ based on following formulas (4).

$$H_n = H_1 (n=1)$$

$$H_n = H_{n-1} - PT_{n-1} - (PHAC_{n-1} - PHSET_{n-1})(n>1) \quad (4)$$

As shown in the formulas (4), the mounting reference height $H_n$ for the $n^{th}$ layer, where "n" is more than two, is the difference obtained by subtracting the thickness $PT_{n-1}$ of the $(n-1)^{th}$ layer chip 2 from the mounting reference height $H_{n-1}$ for the $(n-1)^{th}$ layer and correcting the obtained difference with the difference between the actual push in amount $PHAC_{n-1}$ for the $(n-1)^{th}$ layer and the set push in amount $PHSET_{n-1}$ for the $(n-1)^{th}$ layer. The difference between the actual push in amount $PHAC_n$ and the set push in amount $PHSET_n$ reflects variation in the amount of movement of the mounting head 48 due to an error in the thickness $PT_n$ of the chip 2 held by the mounting head 48 when this chip 2 actually contacts the substrate 5 or already mounted chip 2, differences in the extent of squashing of the bumps 4, and so on. By correcting the mounting reference height $H_n$ using this difference, the accuracy to which the mounting reference height $H_n$ approximates the actual distance from the first reference height position $HB_1$ to the substrate 5 or the already mounted chip 2 can be improved. Therefore, the present embodiment can execute more highly precise stacked mounting.

At step S10-4, the first target movement height calculation unit 104 calculates the target movement height $ZTAG_n$ for the mounting head 48 based on following formula (5).

$$ZTAG_n = H_n - PT_n + PHSET_n \quad (5)$$

As will be understood by the formula (5), the target movement height $ZTAG_n$ for the mounting head 48 for each layer is the value obtained by adding the set push in amount $PHSET_n$ to the difference obtained by subtracting the thickness $PT_n$ of the chip 2 from the mounting reference height $H_n$.

After the mounting operation has been completed at step S10-9, the push in amount sensor 62 detects the actual push in amount $PHAC_n$ at step S10-10. As described above, the actual push in amount $PHAC_n$ is used in the calculation of the mounting reference height $H_n$ and the target movement height $ZTAG_n$ of the mounting head 48 for the next stage.

Figure 11A:
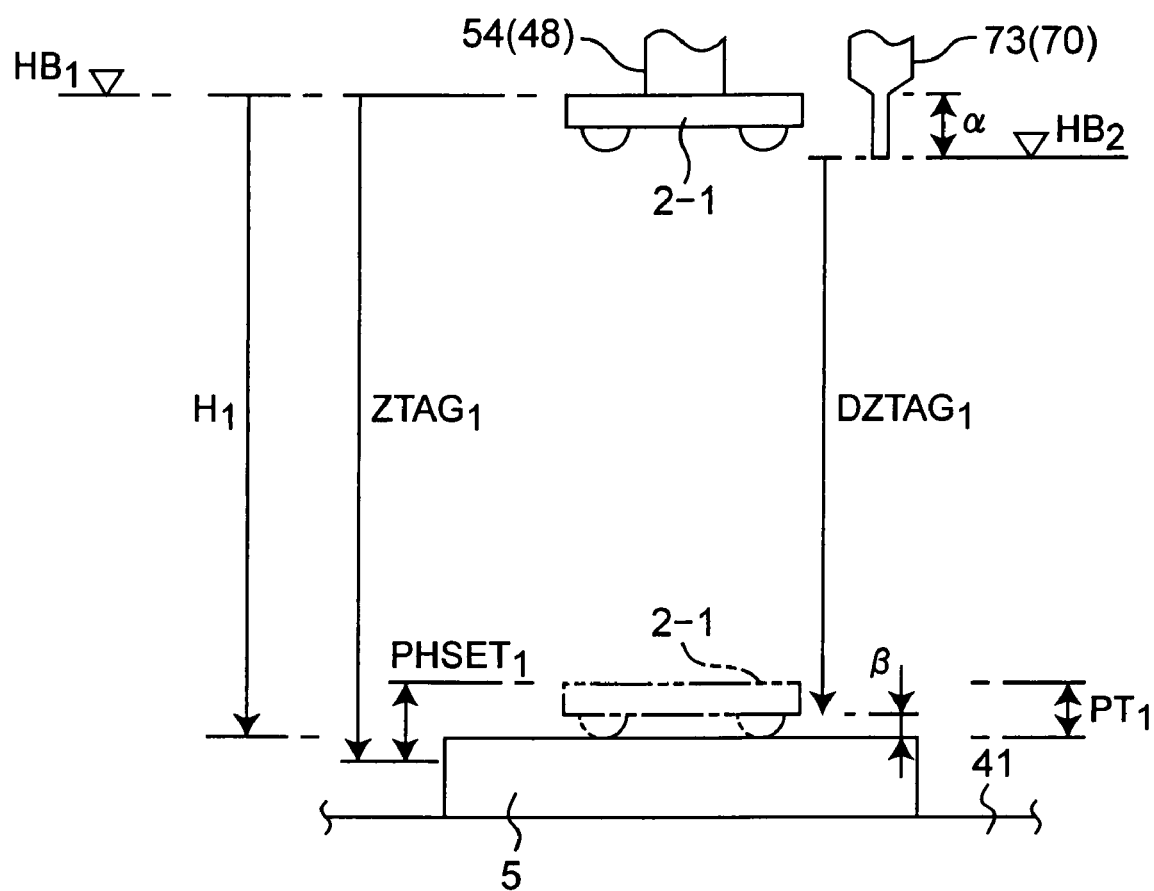
FIG. 11A is a schematic view for explaining first layer mounting in the second embodiment.

FIG. 11A shows a state before mounting the first layer chip 2-1. As shown in FIG. 11A, the mounting reference height $H_1$ for the first layer is the distance from the first reference height position $HB_1$ to the substrate 5 held on the stage 41. Further, the target movement height $ZTAG_1$ for the mounting head 48 for the first layer is the value obtained by adding the set push in amount $PHSET_1$ to the difference obtained by subtracting the thickness $PT_1$ of the first layer chip 2-1 from the mounting reference height $H_1$. Furthermore, the target movement height $DZTAG_1$ for the application head 70 for the first layer is set to a value such that the lower end of the application nozzle 73 is positioned above the substrate 5 by the offset "β".

Figure 11B:
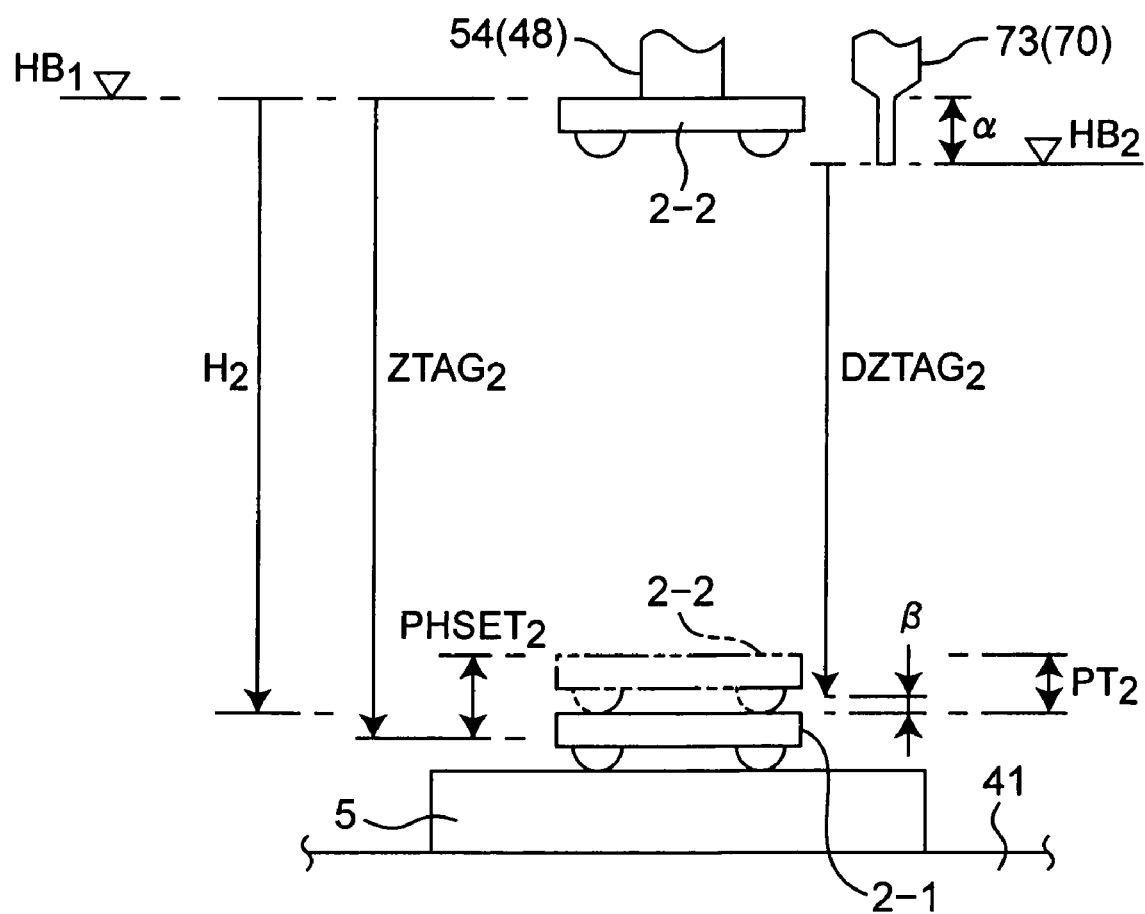
FIG. 11B is a schematic view for explaining second layer mounting in the second embodiment.
Figure 11C:
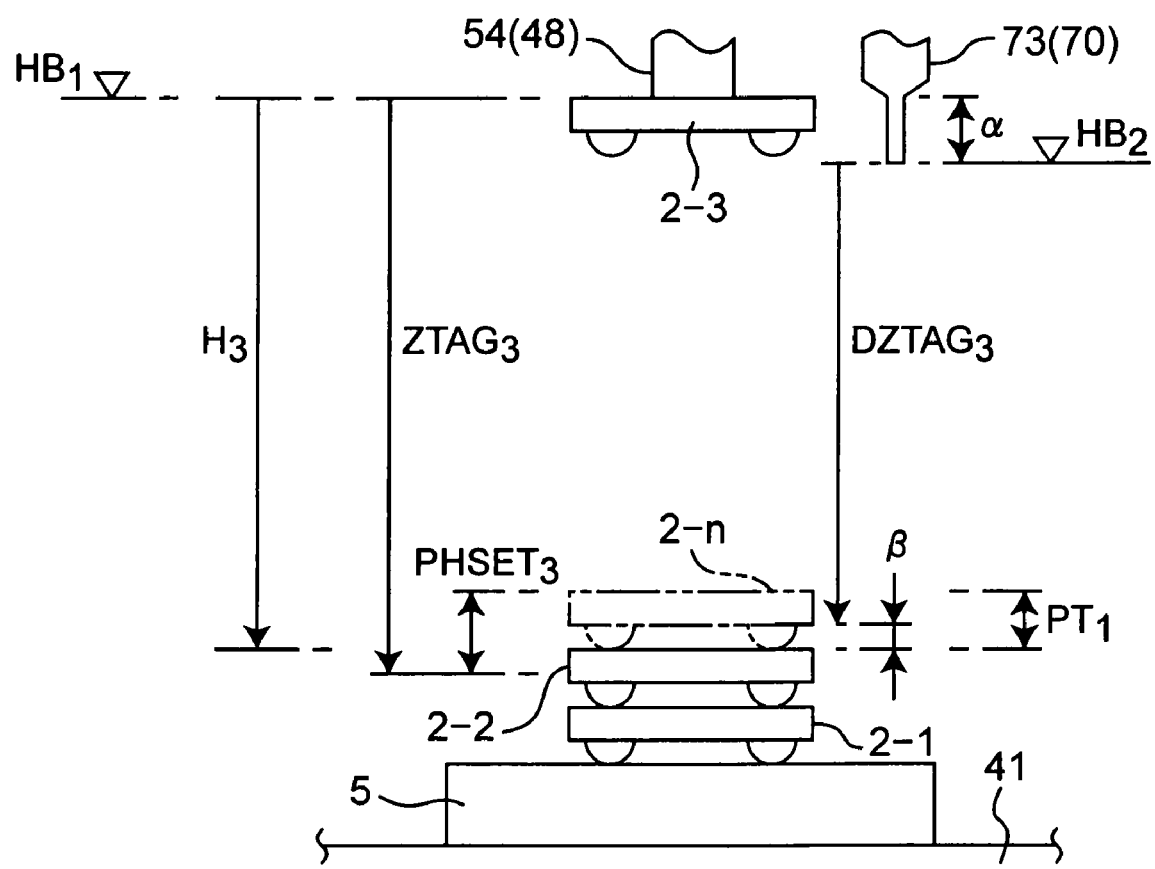
FIG. 11C is a schematic view for explaining third stage mounting in the second embodiment.

FIGS. 11B and 11C show respectively states before mounting the second and third layer chips 2-2 and 2-3. The mounting reference heights $H_2$ and $H_3$ for the second and third layers are respectively the distance from the first reference height position $HB_1$ to the first or second layer chip 2-1, 2-2 already mounted on the substrate 5 corrected with the difference between the actual push in amount $PHAC_1$, $PHAC_2$ and the set push in amount $PHSET_1$, $PHSET_2$. Further, the target movement heights $ZTAG_2$ and $ZTAG_3$ for the mounting head 48 for the second and third layers are respectively the value obtained by adding the set push in amount $PHSET_2$, $PHSET_3$ to the difference obtained by subtracting the thickness $PT_2$, $PT_3$ of the chip 2-2, 2-3 from the mounting reference height $H_2$, $H_3$. Furthermore, the target movement heights $DZTAG_2$ and $DZTAG_3$ for the application head 70 are each set to a value such that the lower end of the application nozzle 73 is positioned above the already mounted chip 2-1 or 2-2 by the offset "β".

Figure 11D:
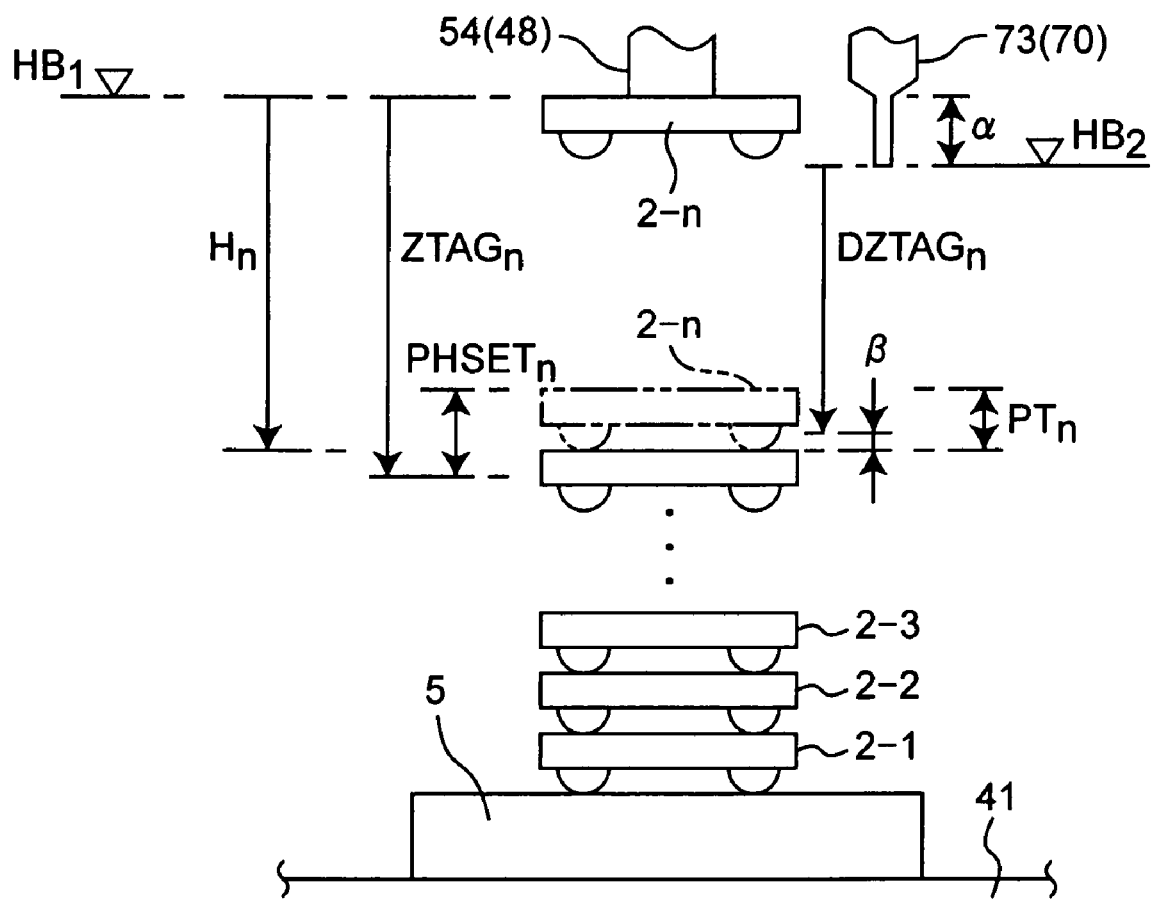
FIG. 11D is a schematic view for explaining $n^{th}$ stage mounting in the second embodiment.

FIG. 11D shows a state before mounting the $n^{th}$ layer chip 2-$n$. The mounting reference height $H_n$ for the $n^{th}$ layer is the value obtained by correcting the distance from the first reference height position $HB_1$ to the substrate 5 or the already mounted chip 2 held on the stage 41 with the difference between the actual push in amount $PHAC_n$ and the set push in amount $PHSET_n$. Further, the target movement height $ZTAG_n$ for the mounting head 48 for the $n^{th}$ stage layer is the value obtained by adding the set push in amount $PHSET_n$ for the current occasion to the difference obtained by subtracting the thickness $PT_n$ of the $n^{th}$ layer chip 2-$n$, i.e. the chip 2-$n$ mounted on the current occasion, from the mounting reference height $H_n$. Furthermore, the target movement height $DZTAG_n$ for the application head 70 for the $n^{th}$ stage is set to a value such that the lower end of the application nozzle 73 is positioned above the substrate 5 by the offset "β".

Other structures and operations of the second embodiment are similar to those of the first embodiment.

Third Embodiment

Figure 12:
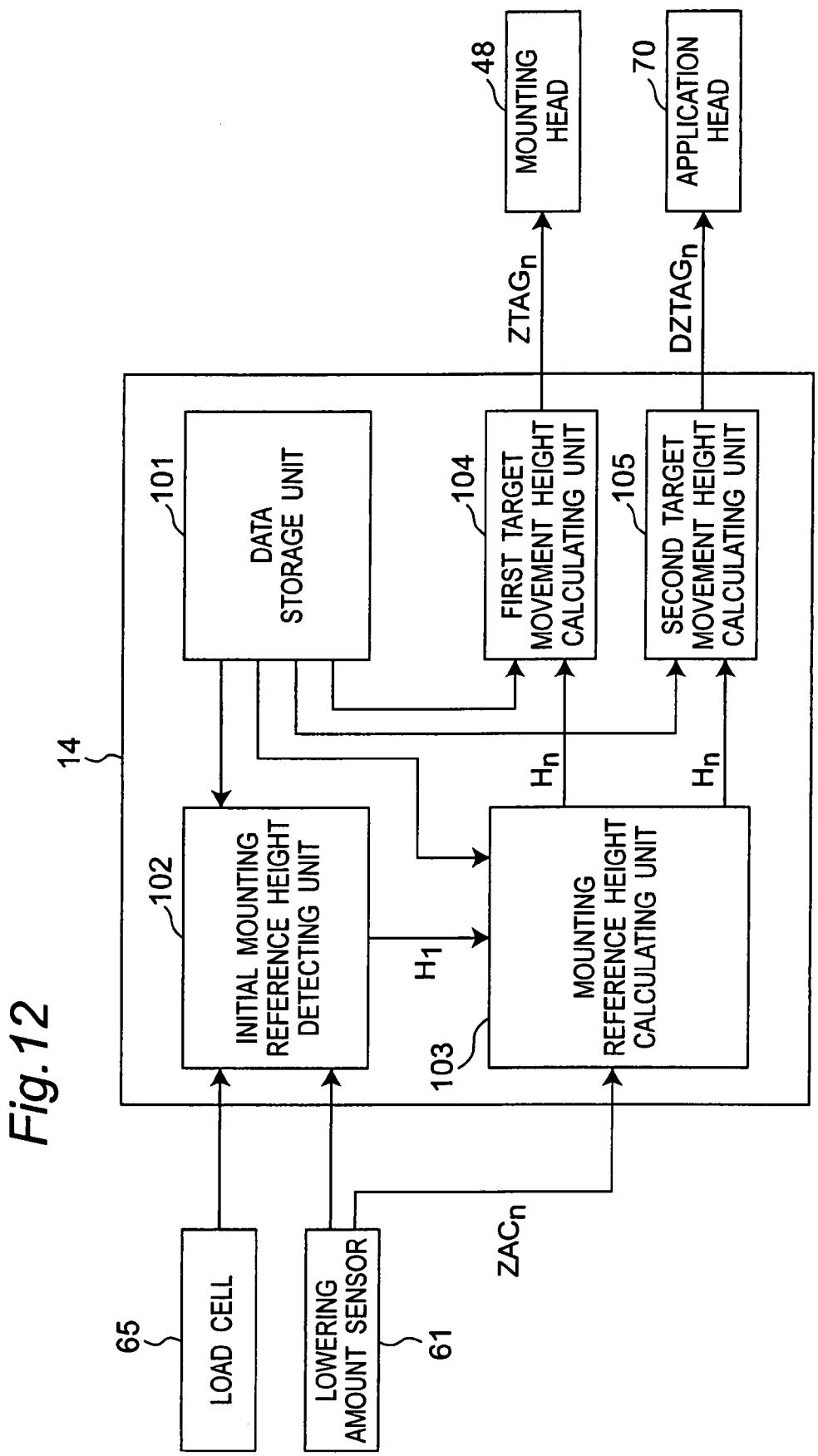
FIG. 12 is a block diagram showing a controller in a third embodiment of the present invention.

FIG. 12 shows the controller 14 in a third embodiment of the present invention. In the present embodiment, the mounting reference height calculation unit 103 uses an actual movement height $ZAC_n$ in the calculation of the mounting reference height $H_n$. The actual movement height $ZAC_n$ is the actual measured height of the mounting head 48 when mounting the chip 2 on the substrate 5 or the already mounted chip 2. This actual movement height $ZAC_n$ is detected by the lowering amount sensor 61. Further, the basis for the actual movement height $ZAC_n$ is the first reference height position $HB_1$, with downward in the vertical direction being taken as positive.

Figure 13:
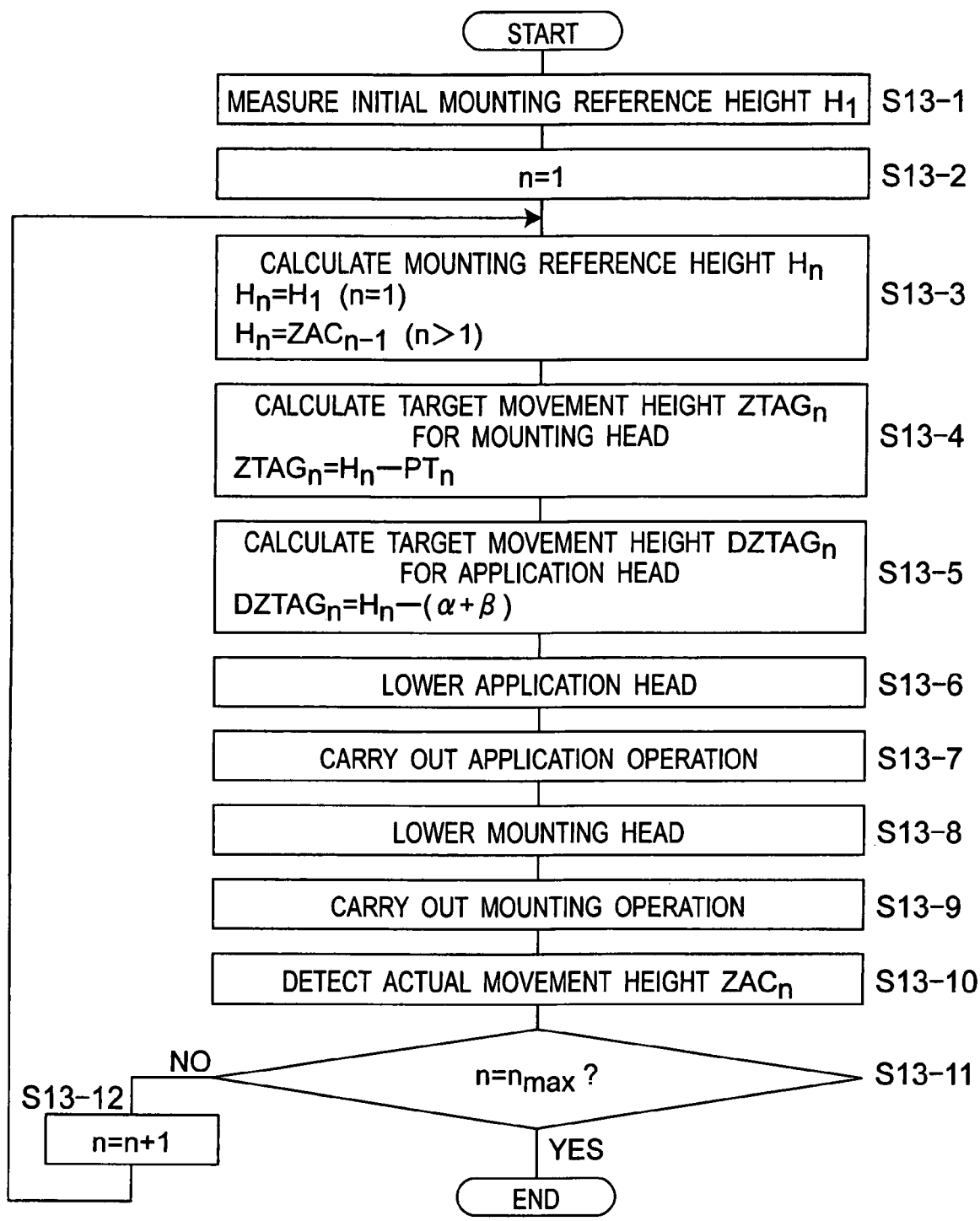
FIG. 13 is a flowchart for explaining operation of the component mounting apparatus according to the third embodiment.

The operation of the controller 14 and the mounting unit 13 will be described with reference to a flowchart of FIG. 13. Of steps S13-1 to S13-12, the processing at steps S13-1, S13-2, S13-4 to S13-9, S13-11 and S13-12 is the same as the processing in the corresponding steps in FIG. 7. In particular, at step S13-4, the first target movement height calculation unit 104 calculates the target movement height $ZTAG_n$ for the mounting head 48 as the difference obtained by subtracting the thickness $PT_n$ of the chip 2 from the mounting reference height $H_n$ as in the first embodiment (step S7-4 in FIG. 7).

At step S13-3, the mounting reference height calculation unit 103 calculates the mounting reference height $H_n$ based on following formulas (6).

$$H_n=H_1(n=1)$$

$$H_n=ZAC_{n-1}(n>1) \qquad (6)$$

As shown in formulas (6), the mounting reference height $H_n$ for the $n^{th}$ stage, where "n" is more than two, is the actual movement height $ZAC_{n-1}$ for the $(n-1)^{th}$ stage. As described above, the actual movement height $ZAC_n$ is the lowering amount by which the mounting head 48 is actually lowered from the first reference height position $HB_1$, and thus reflects an error in the thickness $PT_n$ of the chip 2 held by the mounting head 48 and differences in the extent of squashing of the bumps 4 when this chip 2 contacts the substrate 5 or the already mounted chip 2. By using the actual movement height $ZAC_n$ as the mounting reference height $H_n$ for the next stage, the accuracy to which the mounting reference height $H_n$ approximates the actual distance from the first reference height position $HB_1$ to the substrate 5 or already mounted chip 2 can thus be improved. Therefore, the present embodiment can execute more highly precise stacked mounting.

Other structures and operations of the third embodiment are similar to those of the first embodiment.

Fourth Embodiment

Figure 14:
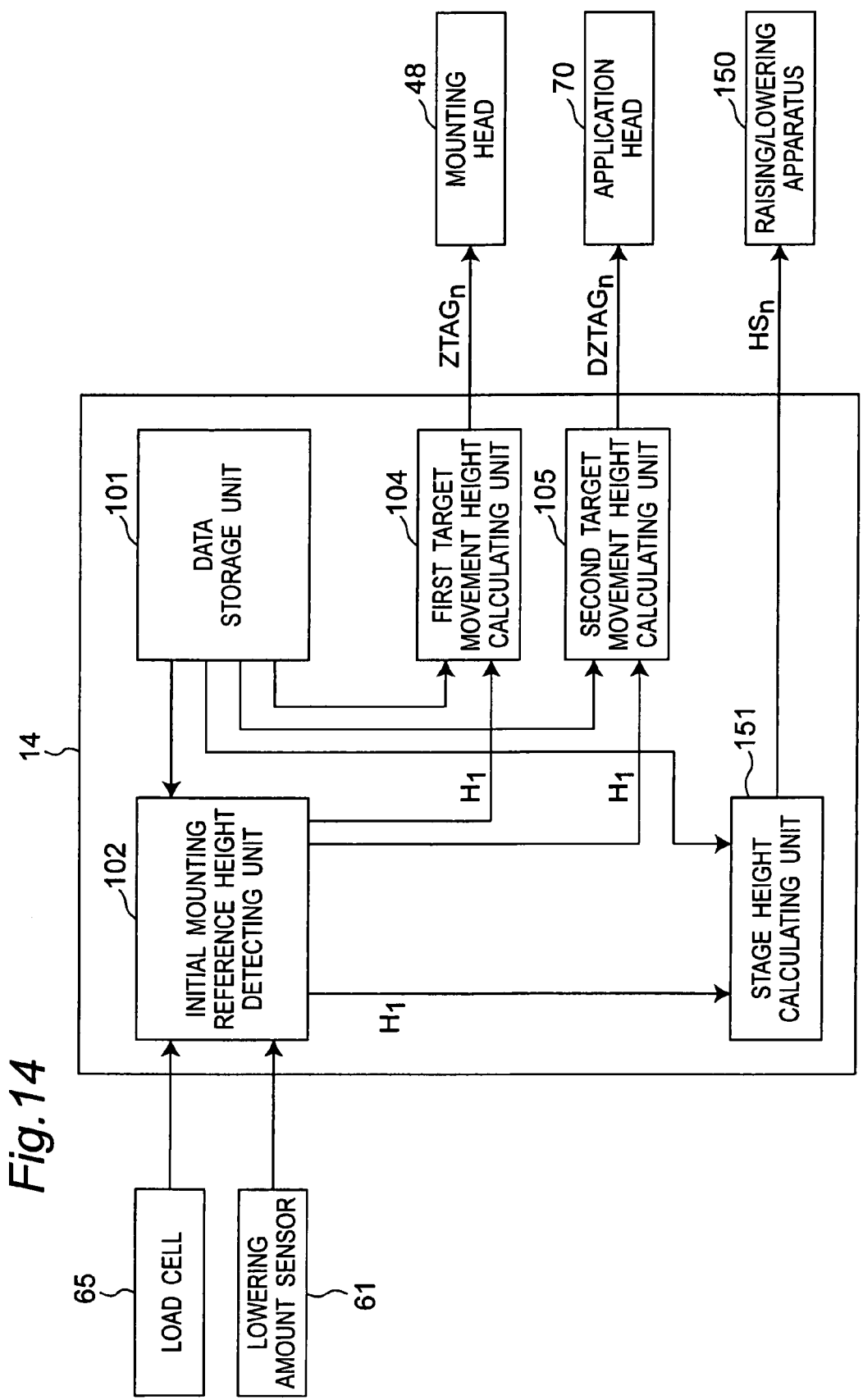
FIG. 14 is a block diagram showing a controller in a fourth embodiment of the present invention.

FIG. 14 shows the controller 14 in a fourth embodiment of the present invention. In the present embodiment, the component mounting apparatus 1 has a raising/lowering apparatus 150 that raises and lowers the stage 41 as shown schematically in FIGS. 16A to 16D.

Figure 16A:
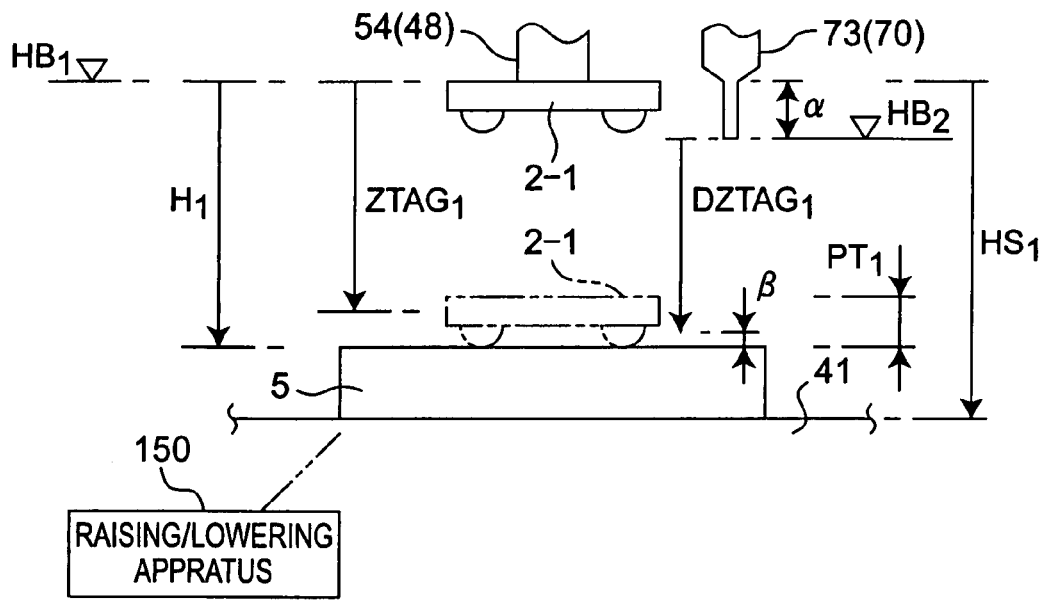
FIG. 16A is a schematic view for explaining first layer mounting in the fourth embodiment.
Figure 16B:
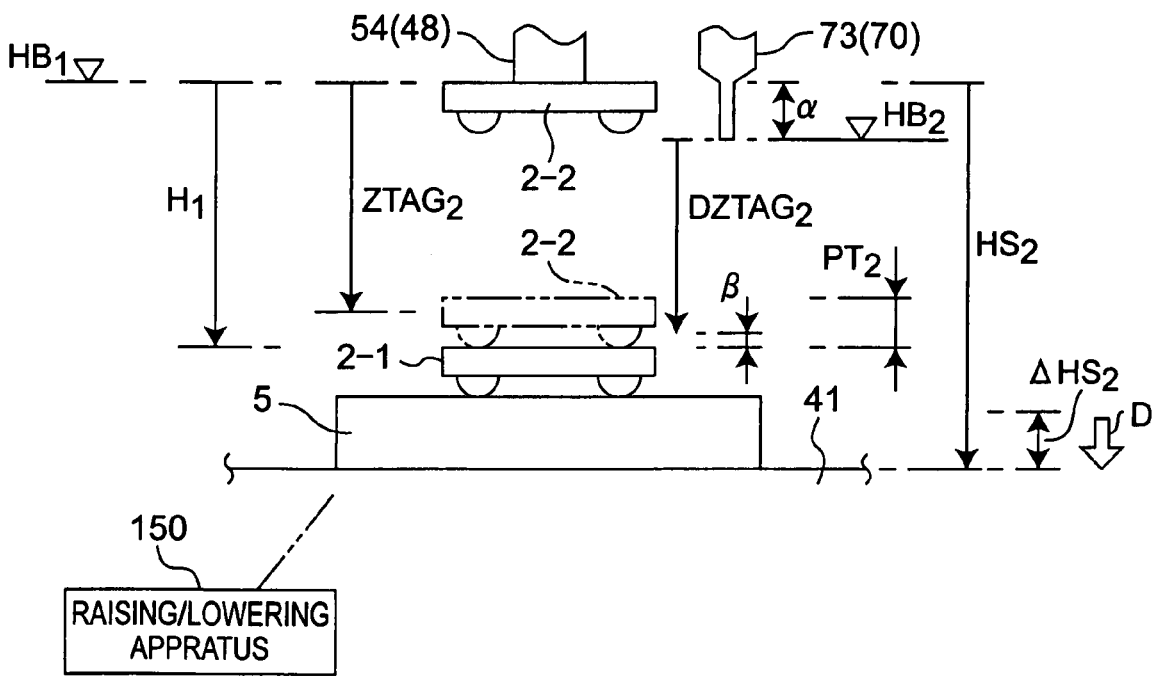
FIG. 16B is a schematic view for explaining second layer mounting in the fourth embodiment.
Figure 16C:
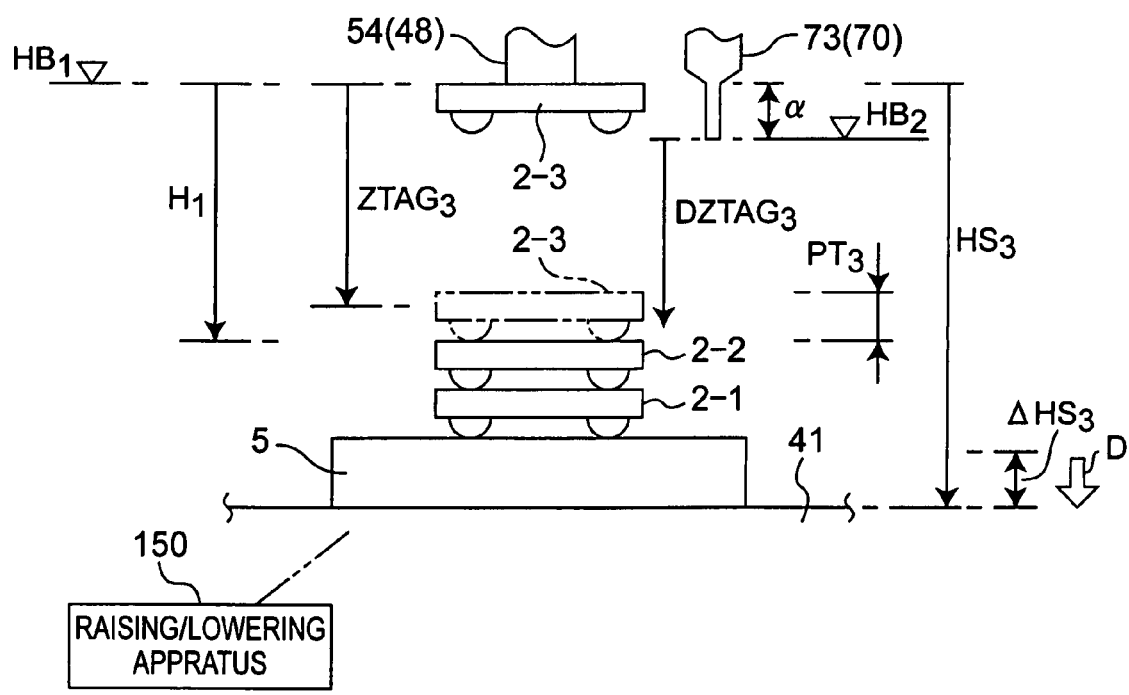
FIG. 16C is a schematic view for explaining third stage mounting in the fourth embodiment.
Figure 16D:
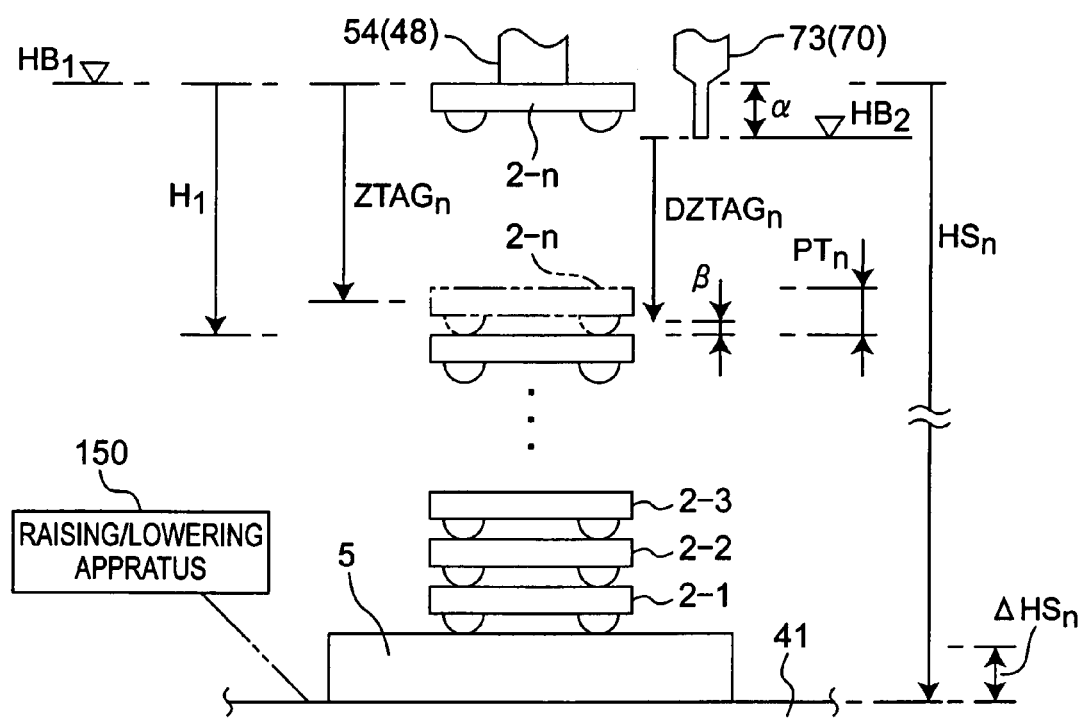
FIG. 16D is a schematic view for explaining $n^{th}$ stage mounting in the fourth embodiment.

The controller 14 has, instead of the mounting reference height calculation unit 103 (see FIG. 4), a stage height calculation unit 151 that calculates a height $HS_n$ of the stage 41 from the first reference height position $HB_1$ such that the initial mounting reference height $H_1$ is kept constant regardless of that the number of layers of chips 2 mounted on the substrate 5 increases (see FIG. 16D). Further, the first and second target movement height calculation units 104 and 105 continue to use the initial mounting reference height $H_1$ to calculate the target movement heights $ZTAG_n$ and $DZTAG_n$ of the mounting head 48 and the application head 70 respectively even as the number of layers of mounted chips 2 increases.

Figure 15:
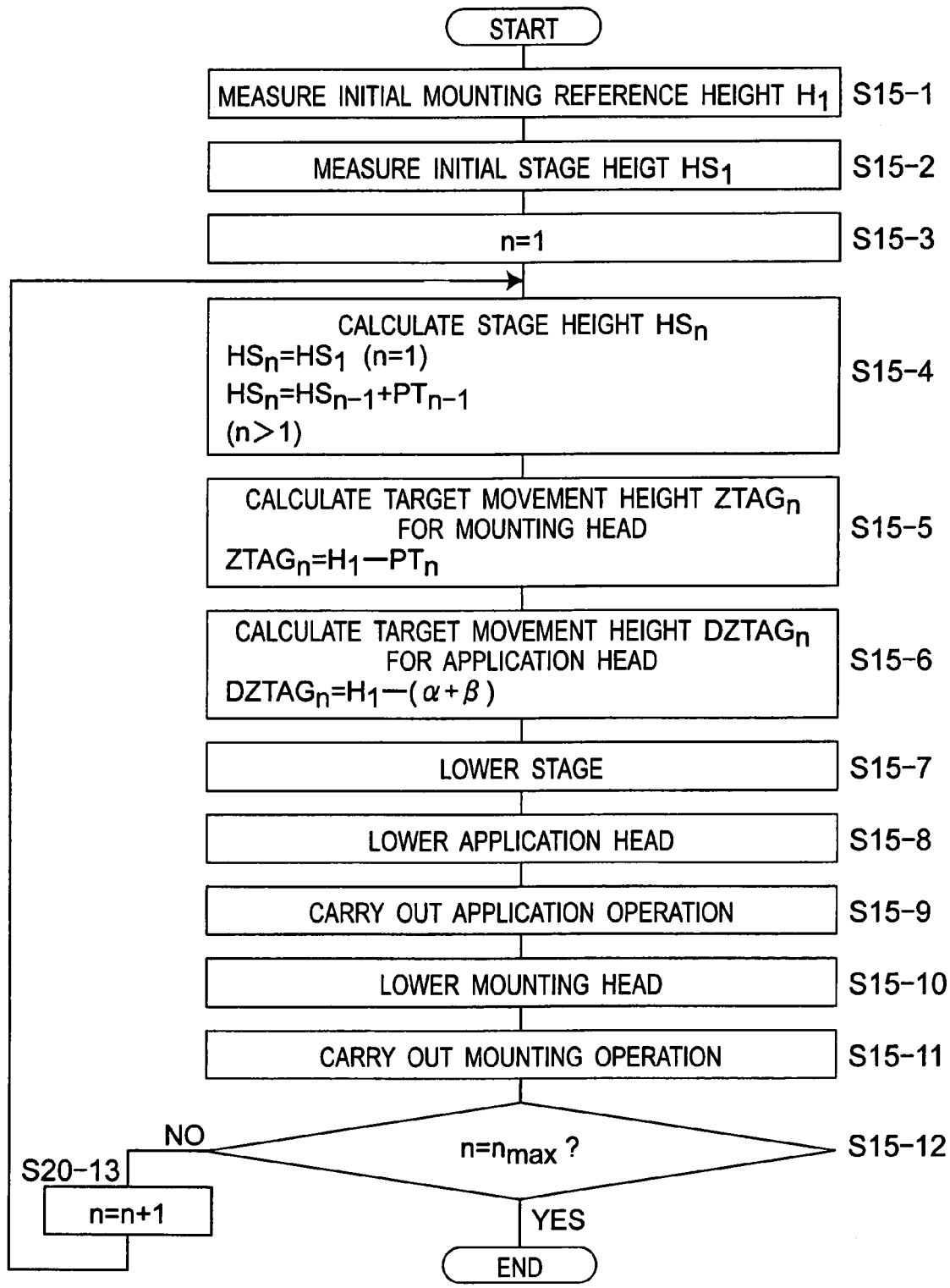
FIG. 15 is a flowchart for explaining operation of the component mounting apparatus according to the fourth embodiment.

The operation of the controller 14 and the mounting unit 13 will be described with reference to the flowchart of FIG. 15. First, at step S15-1, measurement of the initial mounting reference height $H_1$ is executed. Specifically, the mounting head 48 in a state where a chip 2 is not held on the suction nozzle 54 is moved downward toward the substrate 5 on the stage 41. The initial mounting reference height detecting unit 102 detects contact of the suction nozzle 54 to the substrate 5 by the change in the load detected by the load cell 65, and then detects the initial mounting reference height $H_1$ from the input value from the lowering amount sensor 61 at this time. The detected initial mounting reference height $H_1$ is stored in the data storage unit 101.

Next, at step S15-2, the stage height calculation unit 151 calculates the height of the stage 41 for a state in which no chips 2 have yet been mounted on the substrate 5 (initial stage height $HS_1$). The initial stage height $HS_1$ is calculated from the initial mounting reference height $H_1$, and the thickness of the substrate 5 which has been stored in the data storage unit 101.

Steps S15-3 to S15-13 comprise processing for actually mounting a chip 2 on the substrate 5 or the already mounted chip 2. First, at step S15-3, the variable "n" indicating the stage number is set to "1".

At step S15-4, the stage height calculation unit 151 calculates the stage height $HS_n$ based on following formulas (7).

$$HS_n=HS_1(n=1)$$

$$HS_n=HS_{n-1}+PT_{n-1}(n>1) \qquad (7)$$

Here, $HS_n$ represents the stage height for the $n^{th}$ layer, and $HS_1$ represents the initial stage height calculated at step S15-2. Further, the second term on the right side of the second formula represents the thickness of the $(n-1)^{th}$ layer chip 2. As described above, the thicknesses $PT_n$ of the chips 2 in the various layers have been stored in the data storage unit 101.

Next, at step S15-5, the first target movement height calculation unit 104 calculates the target movement height $ZTAG_n$ for the mounting head 48 based on following formula (8).

$$ZTAG_n=H_1-PT_n \qquad (8)$$

Here, $ZTAG_n$ represents the target movement height for the mounting head 48 when mounting the $n^{th}$ layer chip 2, $H_1$ represents the initial mounting reference height, and $PT_n$ represents the thickness of the $n^{th}$ layer chip 2.

At step S15-6, the second target movement height calculation unit 105 calculates the target movement height $DZTAG_n$ for the application head 70 based on following formula (9).

$$DZTAG_n=H_1-(\alpha+\beta) \qquad (9)$$

Here, $H_1$ represents the initial mounting reference height, and "α" represents the difference between the first reference height position $HB_1$ and the second reference height position $HB_2$, i.e. the distance between the lower end of the suction nozzle 54 and the lower end of the application nozzle 73. Further, "β" represents the offset for preventing interference between the application nozzle 73 and the substrate 5 or chip 2.

At step S15-7, the stage 41 is lowered by the raising/lowering apparatus 150 to the stage height $HS_n$ calculated at step S15-4. By lowering the stage 41 in this manner, the mounting reference height is maintained at the initial mounting reference height $H_1$.

At step S15-8, the application head 70 is moved downward toward the stage 41 by the target movement height $DZTAG_n$ calculated at step S15-6. After that, at step S15-9, the operation of application by the application head 70 is executed. The liquid material 6 is applied onto the substrate 5 or the already mounted chip 2 from the application nozzle 73.

At step S15-10, the mounting head 48 is moved downward to the target movement height $ZTAG_n$ calculated at step S15-5. Generally, upon lowering by the target movement height $ZTAG_n$, the chip 2 held by the suction nozzle 54 of the mounting head 48 will contact the substrate 5 or the already mounted chip 2. However, due to an error in the thickness of the chip 2 or the like, there is a possibility that the held chip 2 will contact the substrate 5 or the already mounted chip 2 before the mounting head 48 has been lowered by the target movement height $ZTAG_n$. On the other hand, there is also a possibility that the held chip 2 will not contact the substrate 5 or the already mounted chip 2 in spite of that the mounting head 48 is lowered by the target movement height $ZTAG_n$.

The controller 14 thus monitors occurrence of contact of the held chip 2 with the substrate 5 or the already mounted chip 2 through the load detected by the load cell 65. If the held chip 2 contacts the substrate 5 or the already mounted chip 2 before the target movement height $ZTAG_n$ is reached, then the controller 14 stops the downward movement of the mounting head 48. On the other hand, if the held chip 2 does not contact the substrate 5 or the already mounted chip 2 in spite of that the target movement height $ZTAG_n$ is reached, then the controller 14 continues the lowering of the mounting head 48 until the contact is detected.

Next, at step S15-11, the chip 2 held by suction on the suction nozzle 54 of the mounting head 48 ($n^{th}$ layer chip) is mounted on the substrate 5 or the already mounted chip 2.

After that, at step S15-12, if "$n=n_{max}$" is not true, i.e. if mounting of the final layer chip 2 has not been completed, then the variable "n" is incremented by 1 at step S15-13, and the processing of steps S15-4 to S15-11 is repeated.

The operation of the controller 14 and the mounting unit 13 will be described in more detail with reference to FIGS. 16A to 16D.

FIG. 16A shows a state before mounting the first layer chip 2-1. As shown in FIG. 16A, the initial mounting reference height $H_1$ is the distance from the first reference height position $HB_1$ to the substrate 5 held on the stage 41. Further, the target movement height $ZTAG_1$ for the mounting head 48 for the first layer is the difference obtained by subtracting the thickness $PT_1$ of the first layer chip 2-1 from the initial mounting reference height $H_1$. Furthermore, the target movement height $DZTAG_1$ for the application head 70 for the first layer is set to a value such that the lower end of the application nozzle 73 is positioned above the substrate 5 by the offset "β".

FIG. 16B shows a state before mounting the second layer chip 2-2. The stage 41 has been lowered by the raising/lowering apparatus 150 as shown by an arrow "D" so that even in the state before mounting the second layer chip 2-2 the mounting reference height is maintained at the initial mounting reference height $H_1$. From the formulas (7), a lowering amount $\Delta HS_2$ of the stage 41 when mounting the second layer chip 2-2 is the thickness $PT_1$ of the first layer chip 2-1. Further, the target movement height $ZTAG_2$ for the mounting head 48 for the second layer is the difference obtained by subtracting the thickness $PT_2$ of the chip 2-2 from the initial mounting reference height $H_1$. Furthermore, the target movement height $DZTAG_2$ for the application head 70 is set to a value such that the lower end of the application nozzle 73 is positioned above the already mounted chip 2-1 by the offset "β".

FIG. 16C shows a state before mounting the third layer chip 2-3. The stage 41 has been lowered by the raising/lowering apparatus 150 as shown by arrow "D" so that even in the state before mounting the third layer chip 2-3 the mounting reference height is maintained at the initial mounting reference height $H_1$. From the formulas (7), the lowering amount $\Delta HS_3$ of the stage 41 when mounting the third layer chip 2-3 is the thickness $PT_2$ of the second layer chip 2-2. Further, the target movement height $ZTAG_3$ for the mounting head 48 for the third stage is the difference obtained by subtracting the thickness $PT_3$ of the chip 2-3 from the initial mounting reference height $H_1$. Furthermore, the target movement height $DZTAG_3$ for the application head 70 is set to a value such that the lower end of the application nozzle 73 is positioned above the already mounted chip 2-2 by the offset "β2".

FIG. 16D shows a state before mounting the $n^{th}$ layer chip 2-$n$. As shown in FIG. 16D, the stage 41 has been lowered by the raising/lowering apparatus 150 so that even in the state before mounting the $n^{th}$ layer chip 2 the mounting reference height is maintained at the initial mounting reference height $H_1$.

As described above, according to the component mounting apparatus 1 of the present embodiment, as the number of the already mounted chips 2 increases, i.e., as the number of layers of already mounted chips 2 on the substrate 5 increases, the stage 41 is automatically lowered such that the initial mounting reference height $H_1$ is kept constant. The plural chips 2 can thus be stack-mounted continuously, and hence the stacked mounting can be executed efficiently. Further, because the mounting reference height $H_n$ is maintained at the initial mounting reference height $H_1$, i.e. the mounting reference height is kept constant, the work distance between the double-field-of-view recognition camera 42 (having a fixed Z-direction position) and the chip 2 is kept constant. As a result, position recognition can be executed highly precisely on the already mounted chip 2 by the double-field-of-view recognition camera 42, and hence yet more highly precise mounting on the already mounted chip 2 can be realized.

Other structures and operation of the fourth embodiment are similar to those of the first embodiment.

Fifth Embodiment

Figure 17:
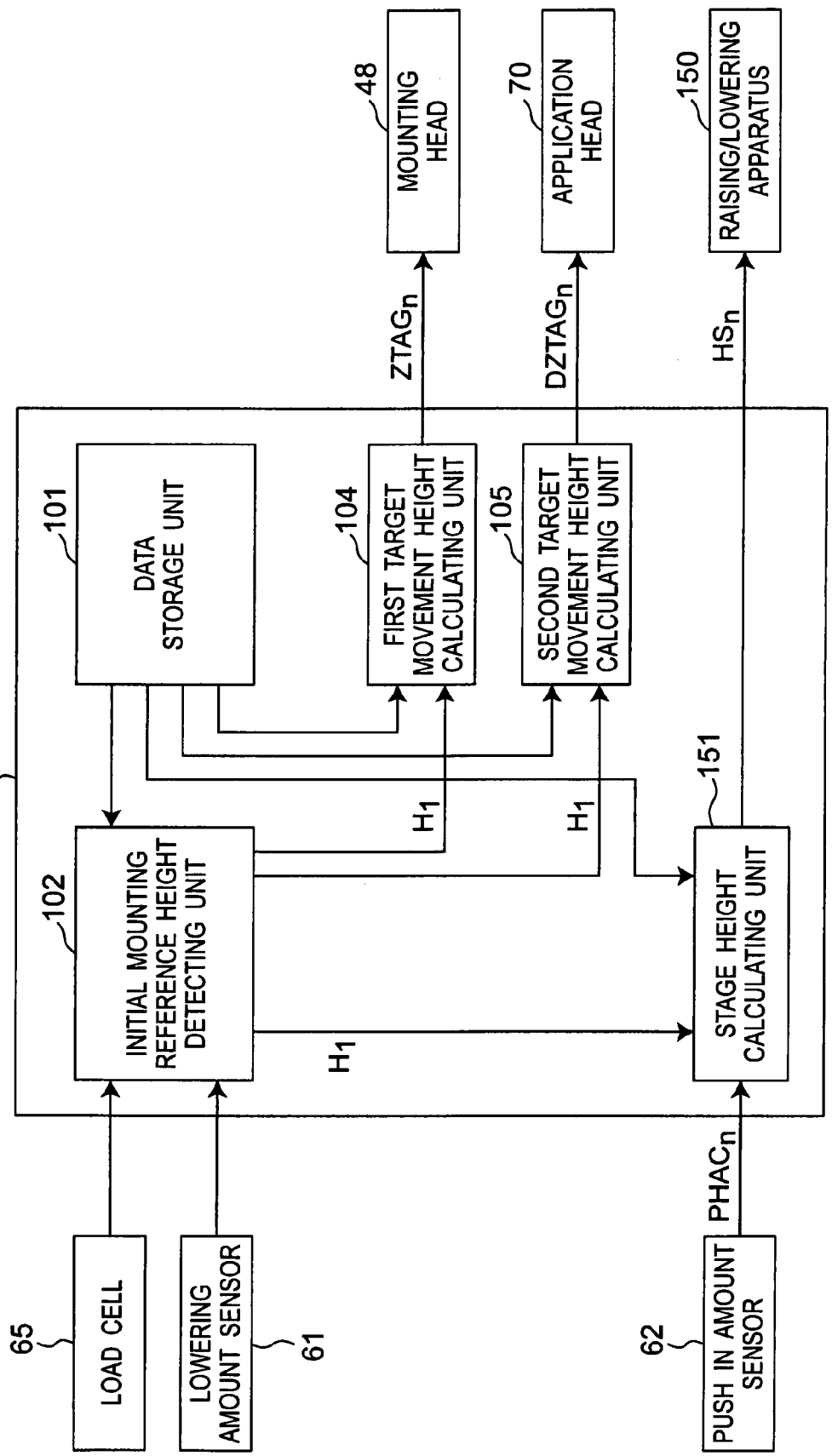
FIG. 17 is a block diagram showing a controller in a fifth embodiment of the present invention.

FIG. 17 shows the controller 14 in a fifth embodiment of the present invention. In the present embodiment, a set push in amount $PHSET_n$ for each layer is stored in the data storage unit 101. Further, the stage height calculation unit 151 uses, in the calculation of the stage height $HS_n$ for each stage, this set push in amount $PHSET_n$ and the actual push in amount $PHAC_n$, which is the actual measured value of the push in amount of the suction nozzle 54 detected by the push in amount sensor 62. Furthermore, the first target movement height calculation unit 104 also uses the set push in amount $PHSET_n$ in the calculation of the target movement height $ZTAG_n$ for the mounting head 48 for each layer.

Figure 18:
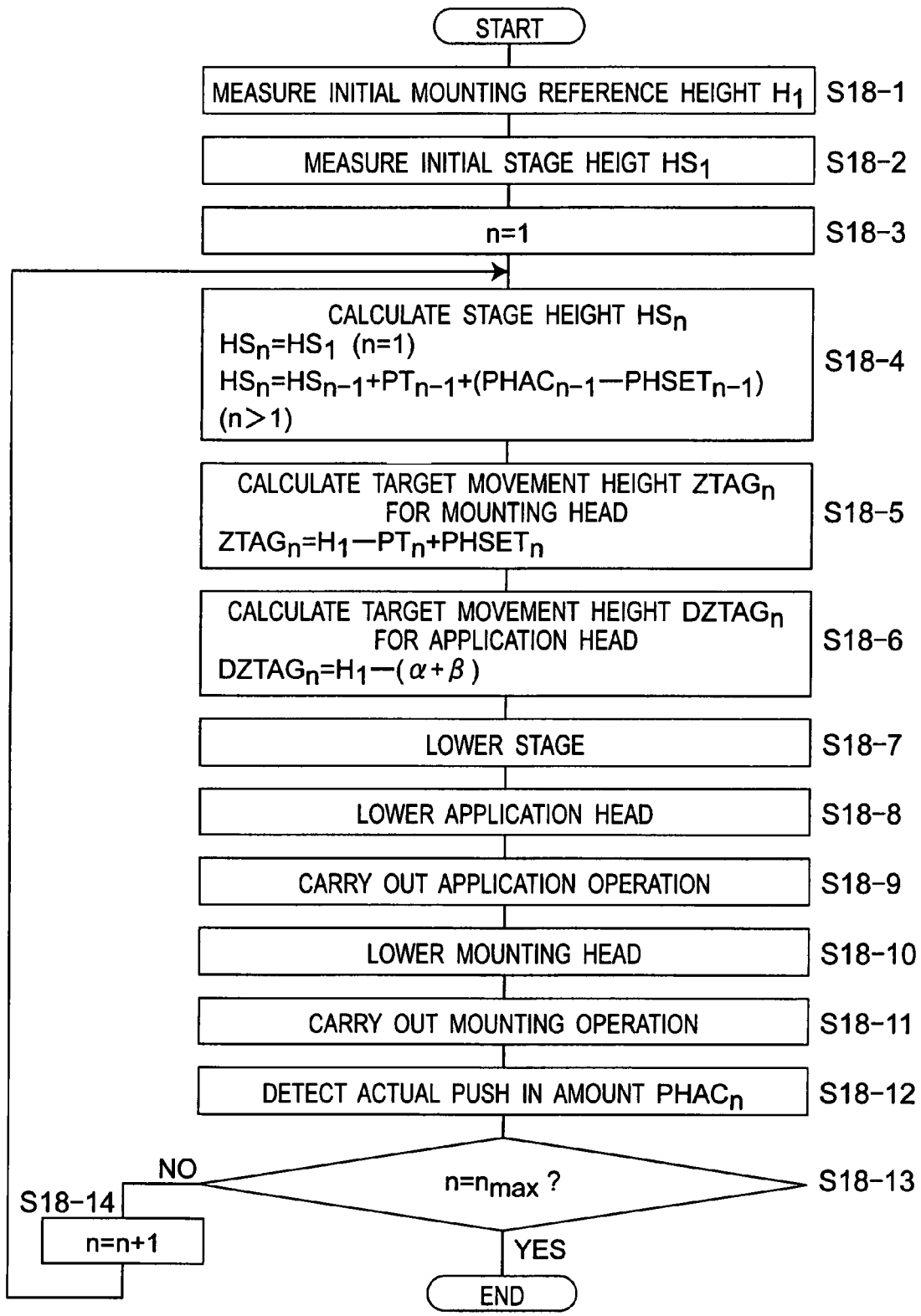
FIG. 18 is a flowchart for explaining operation of the component mounting apparatus according to the fifth embodiment.

The operation of the controller 14 and the mounting unit 13 will be described with reference to the flowchart of FIG. 18. Of steps S18-1 to S18-14, the processing at steps S18-1 to S18-3, S18-6 to S18-11, S18-13 and S18-14 is the same as the processing in the corresponding steps in FIG. 15.

At step S18-4, the stage height calculation unit 151 calculates the stage height $HS_n$ based on following formulas (10).

$$HS_n = HS_1 (n=1)$$

$$HS_n = HS_{n-1} + PT_{n-1} + (PHAC_{n-1} - PHSET_{n-1})(n>1) \quad (10)$$

As shown in formulas (10), the stage height $HS_n$ for the $n^{th}$ stage, where n is more than two, is the sum of the stage height $HS_{n-1}$ for the $(n-1)^{th}$ layer and the thickness $PT_{n-1}$ of the $(n-1)^{th}$ layer chip 2 corrected with the difference between the actual push in amount $PHAC_{n-1}$ for the $(n-1)^{th}$ layer and the set push in amount $PHSET_{n-1}$ for the $(n-1)^{th}$ layer. In other words, the lowering amount $\Delta HS_n$ of the stage 41 for each layer (see FIG. 16D) is $PT_{n-1} + (PHAC_{n-1} - PHSET_{n-1})$. The difference between the actual push in amount $PHAC_n$ and the set push in amount $PHSET_n$ reflects variation in the amount of movement of the mounting head 48 due to an error in the thickness $PT_n$ of the chip 2 held by the mounting head 48, differences in the extent of squashing of the bumps 4 when this chip 2 actually contacts the substrate 5 or already mounted chip 2, and so on. By the correction using this difference, the accuracy of the calculation of the stage height $HS_n$ can thus be improved, and hence yet more highly precise stacked mounting can be executed.

At step S18-5, the first target movement height calculation unit 104 calculates the target movement height $ZTAG_n$ for the mounting head 48 based on following formula (11).

$$ZTAG_n = H_1 - PT_n + PHSET_n \quad (11)$$

As will be understood by the formula (11), the target movement height $ZTAG_n$ for the mounting head 48 for each layer is the value obtained by adding the set push in amount $PHSET_n$ to the difference obtained by subtracting the thickness $PT_n$ of the chip 2 from the initial mounting reference height $H_1$.

After the mounting operation has been completed at step S18-11, the push in amount sensor 62 detects the actual push in amount $PHAC_n$ at step S18-12. As described above, the actual push in amount $PHAC_n$ is used in the calculation of the stage height $HS_n$ for the next layer.

Other structures and operation of the fifth embodiment are similar to those of the first embodiment.

Sixth Embodiment

Figure 19:
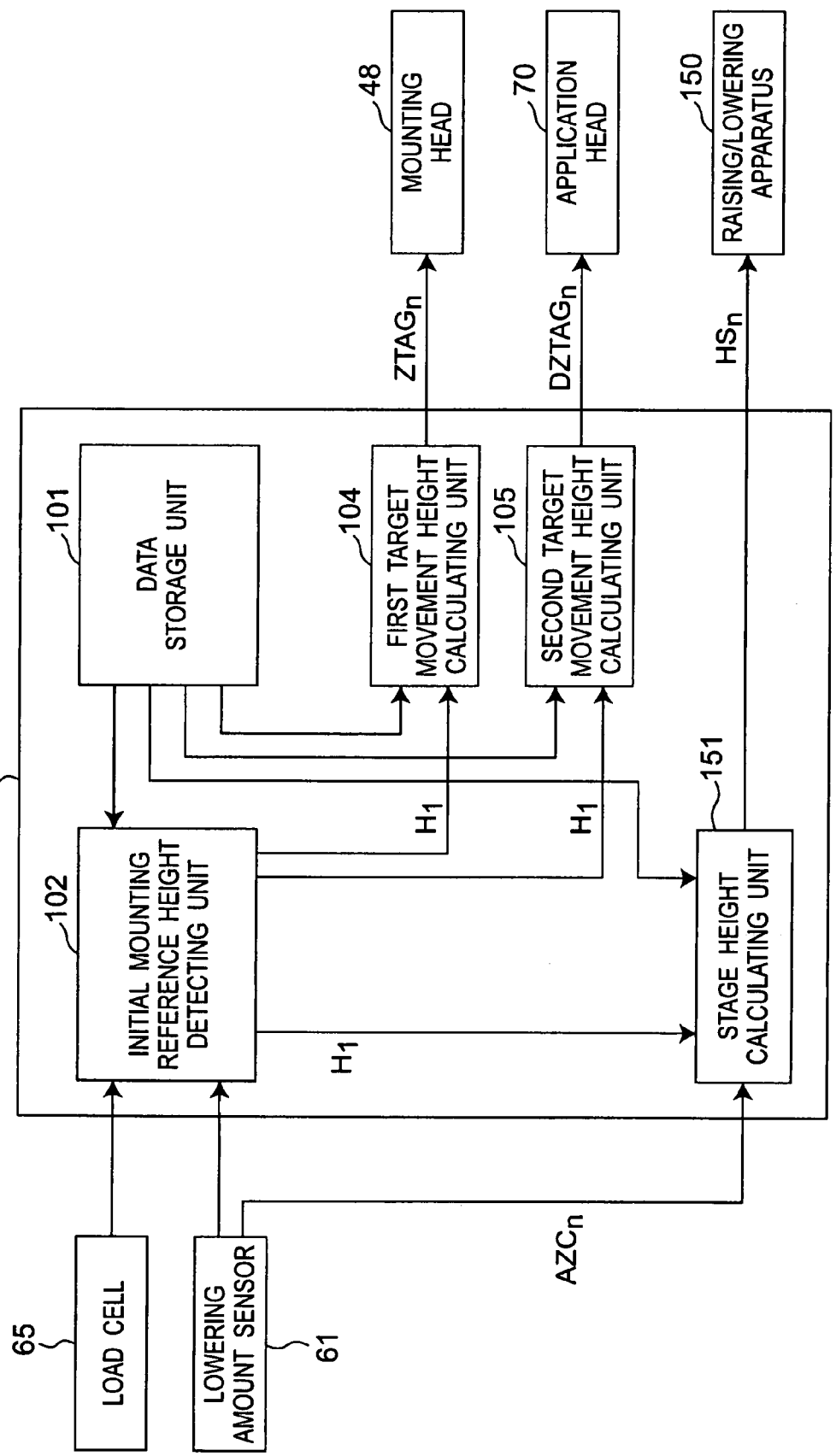
FIG. 19 is a block diagram showing a controller in a sixth embodiment of the present invention.

FIG. 19 shows the controller 14 in a sixth embodiment of the present invention. In the present embodiment, the stage height calculation unit 151 uses the actual movement height $ZAC_n$ in the calculation of the stage height $HS_n$. The actual movement height $ZAC_n$ is the actual measured value of the mounting head 48 when mounting a chip 2 on the substrate 5 or the already mounted chip 2. This actual movement height $ZAC_n$ is detected by the lowering amount sensor 61.

Figure 20:
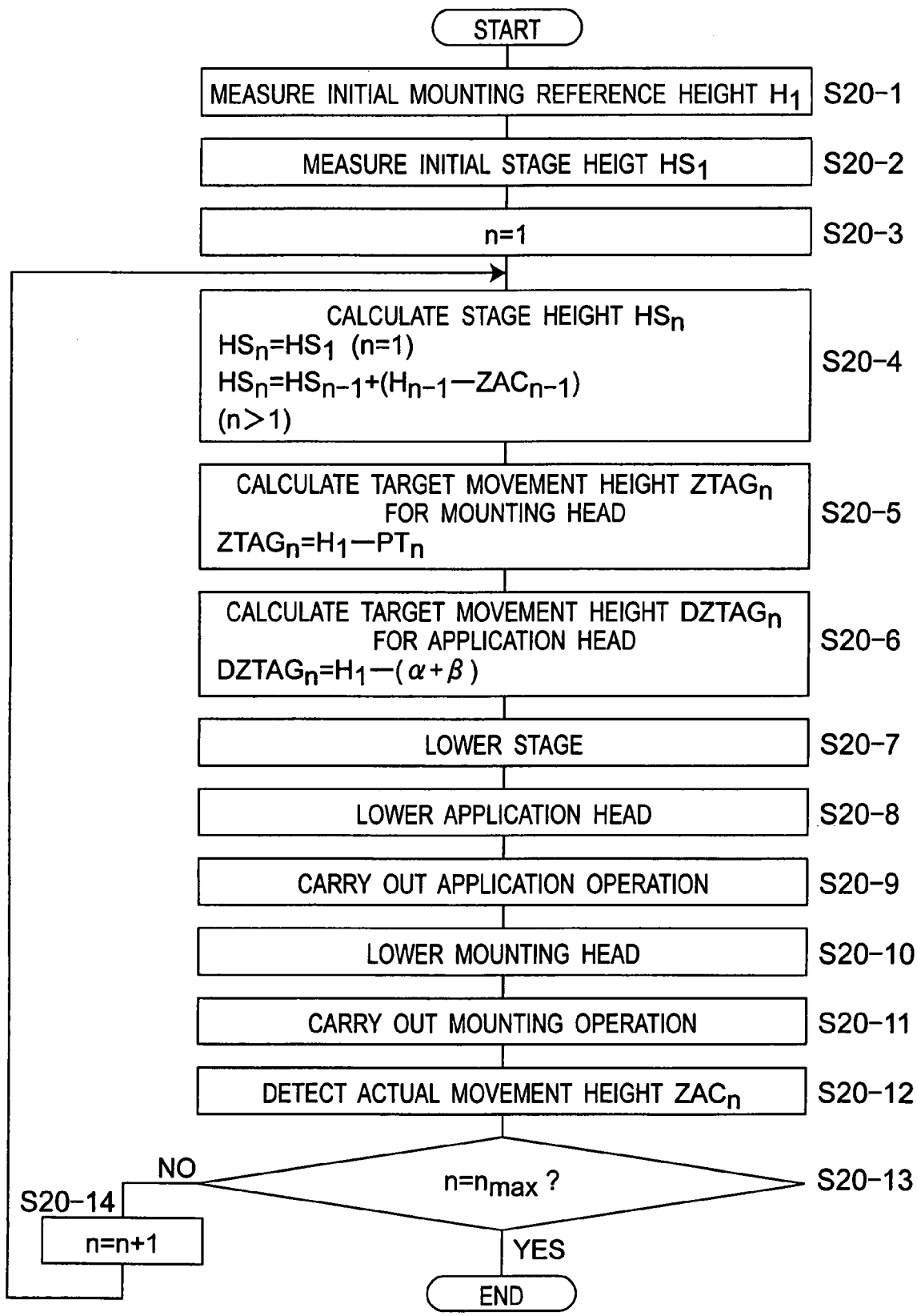
FIG. 20 is a flowchart for explaining operation of the component mounting apparatus according to the sixth embodiment.

The operation of the controller 14 and the mounting unit 13 will be described with reference to the flowchart of FIG. 20. Of steps S20-1 to S20-14, the processing at steps S20-1 to S20-3, S20-6 to S20-11, S20-13 and S20-14 is the same as the processing in the corresponding steps in FIG. 15.

At step S20-4, the stage height calculation unit 151 calculates the stage height $HS_n$ based on following formulas (12).

$$HS_n = HS_1 (n=1)$$

$$HS_n = HS_{n-1} + (H_{n-1} - ZAC_{n-1})(n>1) \quad (12)$$

As shown in formulas (12), the stage height $HS_n$ for the $n^{th}$ stage, where n is more than two, is the stage height $HS_{n-1}$ for the $(n-1)^{th}$ stage plus the difference obtained by subtracting the actual movement height $ZAC_{n-1}$ for the $(n-1)^{th}$ layer from the mounting reference height $H_{n-1}$ for the $(n-1)^{th}$ layer. As described above, the actual movement height $ZAC_n$ is the lowering amount by which the mounting head 48 is actually lowered from the first reference height position $HB_1$, and thus reflects an error in the thickness $PT_n$ of the chip 2 held by the mounting head 48, and differences in the extent of squashing of the bumps 4 when this chip 2 contacts the substrate 5 or already mounted chip 2. By using the actual movement height $ZAC_n$ in the calculation of the stage height $HS_n$ for the next layer, the accuracy of the calculation of the stage height $HS_n$ can thus be improved, and hence yet more highly precise stacked mounting can be executed.

After the mounting operation has been completed at step S18-11, the lowering amount sensor 61 detects the actual movement height $ZAC_n$ at step S18-12. As described above, the actual movement height $ZAC_n$ is used in the calculation of the stage height $HS_n$ for the next layer.

Other structures and operation of the sixth embodiment are similar to those of the first embodiment.

Although the present invention has been fully described with reference to the accompanying drawings, it is to be noted that various changes and modifications are apparent to those skilled in the art. Such changes and modifications are to be understood as included within the scope of the present invention as defined by the appended claims unless they depart from the intention or scope of the present invention.

The invention claimed is:

1. A component mounting apparatus for mounting a plurality of components in a stacked manner, comprising:
    a stage with a fixed height position;
    a mounting head adapted to releasably hold one of the components mountable in a stacked manner, to be moved downward toward the stage from a first reference height position fixedly positioned above the stage, and to sequentially mount the component held by the mounting head on an upper-most component at the stage in a stacked manner;
    a recognition camera capable of recognizing the component held by the mounting head and the upper-most component at the stage; and
    a controller for controlling the mounting head so as to repeat a mounting operation in which another one of the components is held by the mounting head and sequentially mounted on a respective upper-most component at the stage, wherein the controller comprises
        a mounting reference height calculation unit for calculating, for each mounting operation, a mounting reference height corresponding to a distance from the first reference height position to a mounted surface of the upper-most component at the stage such that the mounting reference height approaches the first reference height position as a number of components sequentially mounted at the stage increases, and
        a first target movement height calculation unit for calculating, for each mounting operation, a first target movement height based on at least the mounting reference height calculated by the mounting reference height calculation unit and a thickness of the component held by the mounting head, the first target movement height decreasing as the number of components sequentially mounted at the stage increases,
    wherein the controller, for each mounting operation, makes the mounting head execute an alignment of the component held by the mounting head with the upper-most component at the stage based on a recognition result of the recognition camera, and then moves the mounting head downward from the first reference height position to the first target movement height to mount the component held by the mounting head on the upper-most component at the stage.

2. The component mounting apparatus according to claim 1, wherein the mounting head includes:
    a holding portion for holding one of the components;
    a base portion relative to which the holding portion can be displaced in a direction of the first reference height position; and
    a first sensor for detecting an actual push amount which is an amount of displacement of the holding portion relative to the base portion as the component held by the mounting head is mounted on the upper-most component at the stage, and
    wherein the mounting reference height calculation unit calculates the mounting reference height based on at least the actual push amount.

3. The component mounting apparatus according to claim 1, wherein the mounting head is provided with a second sensor for detecting an actual movement height which is a height of the mounting head with reference to the first reference height position as the component held by the mounting head is mounted on the upper-most component at the stage, and wherein the mounting reference height calculation unit calculates the mounting reference height based on at least the actual movement height.

4. The component mounting apparatus according to claim 1, wherein the recognition camera is capable of recognizing the component held by the mounting head and a lower-most component of the components at the stage, and wherein the controller executes the alignment of the component held by the mounting head using a recognition result of the lower-most component by the recognition camera.

5. The component mounting apparatus according to claim 1, wherein the recognition camera is capable of recognizing the component held by the mounting head and the upper-most component at the stage, and wherein the controller executes the alignment of the component held by the mounting head using a recognition result of the upper-most component by the recognition camera.

6. The component mounting apparatus according to claim 1, further comprising:

an application head adapted to be moved downward toward the stage from a second reference height position fixedly positioned above the stage to apply a liquid material onto the upper-most component at the stage, and wherein the controller further includes a second target movement height calculation unit for calculating a second target movement height based on at least the mounting reference height, the controller moving the application head downward from the second reference height position to the second target movement height calculated by the second target movement height calculation unit to apply the liquid material onto the upper-most component at the stage.

7. A component mounting apparatus for mounting a plurality of components in a stacked manner, comprising:

a stage capable of being raised and lowered;

a mounting head adapted to releasably hold one of the components mountable in a stacked manner, to be moved downward toward the stage from a first reference height position fixedly positioned above the stage, and to sequentially mount the component held by the mounting head on an upper-most component at the stage;

a recognition camera capable of recognizing the component held by the mounting head and the upper-most component at the stage; and a controller for controlling the mounting head so as to repeat a mounting operation in which another one of the components is held by the mounting head and sequentially mounted on a respective upper-most component at the stage, wherein the controller comprises a stage height calculation unit for calculating, for each mounting operation, a stage height which is a distance of the stage from the first reference height position and which increases as a number of components sequentially mounted at the stage increases, such that a mounting reference height corresponding to a distance from the first reference height position to a mounted surface of the upper-most component at the stage is kept constant, wherein the mounted surface of the upper-most component rises as the number of components sequentially mounted at the stage increases, and a first target movement height calculation unit for calculating, for each mounting operation, a first target movement height based on at least the mounting reference height and a thickness of the component held by the mounting head, wherein the controller, for each mounting operation, lowers the stage to the stage height calculated by the stage height calculation unit, makes the mounting head execute an alignment of the component held by the mounting head with the upper-most component at the stage based on a recognition result of the recognition camera, and then moves the mounting head which holds the component downward from the first reference height position to the first target movement height calculated by the first target movement height calculation unit to mount the component held by the mounting head on the upper-most component at the stage.

8. The component mounting apparatus according to claim 7, wherein the mounting head includes:

a holding portion for holding one of the components;

a base portion relative to which the holding portion can be displaced in a direction of the first reference height position; and a first sensor for detecting an actual push amount which is an amount of displacement of the holding portion relative to the base portion as the component held by the mounting head is mounted on the upper-most component at the stage, and wherein the stage height calculation unit calculates the stage height based on at least the actual push amount.

9. The component mounting apparatus according to claim 7, wherein the mounting head is provided with a second sensor for detecting an actual movement height which is a height of the mounting head with reference to the first reference height position as the component held by the mounting head is mounted on the upper-most component at the stage, and wherein the stage height calculation unit calculates the stage height based on at least the actual movement height.

10. The component mounting apparatus according to claim 7, further comprising an application head adapted to be moved downward toward the stage from a second reference height position fixedly positioned above the stage to apply a liquid material onto the upper-most component at the stage, and wherein the controller further includes a second target movement height calculation unit for calculating a second target movement height based on at least the mounting reference height, the controller moving the application head downward from the second reference height position to the second target movement height calculated by the second target movement height calculation unit to apply the liquid material onto the upper-most component at the stage.

11. A component mounting method for mounting a plurality of components in a stacked manner, comprising:

providing a stage with a fixed height position;

providing a mounting head adapted to releasably hold one of the components mountable in a stacked manner, and to sequentially mount the component held by the mounting head on an upper-most component at the stage; and sequentially mounting components in a stacked manner, wherein for each component to be sequentially mounted, said sequential mounting comprises calculating a mounting reference height corresponding to a distance from a fixed reference height position above the stage to a mounted surface of the upper-most component at the stage, such that the mounting reference height approaches the fixed reference height position as a number of components sequentially mounted at the stage increases, calculating a target movement height based on at least the mounting reference height and a thickness of the component held by the mounting head, the target movement height decreasing as the number of components sequentially mounted at the stage increases, recognizing the the component held by the mounting head and the upper-most component at the stage by a recognition camera, aligning the component held by the mounting head with the upper-most component at the stage using a recognition result from the recognition camera, and moving the mounting head downward from the reference height position to the target movement height to mount the component held by the mounting head on the upper-most component at the stage.

12. A component mounting method for mounting a plurality of components in a stacked manner, comprising:

providing a stage capable of being raised and lowered;

providing a mounting head adapted to releasably hold one of the components mountable in a stacked manner, and to sequentially mount the component held by the mounting head on an upper-most component at the stage; and sequentially mounting components in a stacked manner, wherein for each component to be sequentially mounted, said sequential mounting comprises calculating a stage height which is a distance of the stage from a fixed reference height position above the stage and which increases as a number of components sequentially mounted at the stage increases, such that a mounting reference height corresponding to a distance from the reference height position to a mounted surface of the upper-most component is kept constant, wherein the mounted surface of the upper-most component rises as the number of components sequentially mounted at the stage increases calculating a first target movement height based on at least the mounting reference height and a thickness of the component held by the mounting head, lowering the stage to the calculated stage height, recognizing the component held by the mounting head and the upper-most component at the stage by a recognition camera, aligning the component held by the mounting head with the upper-most component at the stage using a recognition result from the recognition camera, and moving the mounting head downward from the reference height position to the target movement height to mount the component held by the mounting head on the upper-most component at the stage.

* * * * *